US010559859B2

(12) United States Patent
Lemke et al.

(10) Patent No.: US 10,559,859 B2
(45) Date of Patent: Feb. 11, 2020

(54) INTEGRATED CIRCUIT STRUCTURE AND A BATTERY STRUCTURE

(71) Applicant: Infineon Technologies AG, Neubiberg (DE)

(72) Inventors: Marko Lemke, Dresden (DE); Stefan Tegen, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 584 days.

(21) Appl. No.: 14/037,422

(22) Filed: Sep. 26, 2013

(65) Prior Publication Data
US 2015/0086809 A1    Mar. 26, 2015

(51) Int. Cl.
| | | |
|---|---|---|
| *H01L 23/50* | (2006.01) | |
| *H01M 10/42* | (2006.01) | |
| *H01M 10/04* | (2006.01) | |
| *H01M 10/0562* | (2010.01) | |
| *H01M 10/0525* | (2010.01) | |

(52) U.S. Cl.
CPC ..... *H01M 10/425* (2013.01); *H01M 10/0436* (2013.01); *H01L 23/50* (2013.01); *H01L 2924/0002* (2013.01); *H01M 10/0525* (2013.01); *H01M 10/0562* (2013.01)

(58) Field of Classification Search
CPC ........... H01M 10/0436; H01M 10/425; H01M 10/0562; H01M 10/0525; H01L 21/762; H01L 21/76205; H01L 21/76232; H01L 21/76235; H01L 27/10823; H01L 27/10829; H01L 27/10838; H01L 29/407

USPC .............. 29/730–731, 623.1–623.5
See application file for complete search history.

(56) References Cited

U.S. PATENT DOCUMENTS

| | | | |
|---|---|---|---|
| 5,499,030 A | 3/1996 | Wicks et al. | |
| 6,495,283 B1 | 12/2002 | Yoon et al. | |
| 8,932,947 B1* | 1/2015 | Han ...................... | H01L 21/762 257/E21.218 |
| 9,024,809 B2 | 5/2015 | Testar | |
| 2002/0092558 A1 | 7/2002 | Kim et al. | |
| 2005/0156780 A1 | 7/2005 | Bonthron et al. | |
| 2006/0137737 A1 | 6/2006 | Nakayama et al. | |

(Continued)

FOREIGN PATENT DOCUMENTS

| | | |
|---|---|---|
| CN | 1849413 A | 10/2006 |
| CN | 1856883 A | 11/2006 |

(Continued)

OTHER PUBLICATIONS

Zeghbroech ("Principles of Semiconductor Devices: Chapter 6: MOS Capacitors", http://ecee.colorado.edu/~bart/book/book/chapter6/ch6_2.htm).*

(Continued)

*Primary Examiner* — Stephen J Yanchuk
(74) *Attorney, Agent, or Firm* — Viering, Jentschura & Partner MBB

(57) ABSTRACT

According to various embodiments, an integrated circuit structure may include: an electronic circuit being arranged on a surface of a carrier; and a solid state electrolyte battery being at least partially arranged within the carrier, wherein at least a part of the solid state electrolyte battery being arranged within the carrier is overlapping with the electronic circuit along a direction parallel to the surface of the carrier.

21 Claims, 14 Drawing Sheets

(56) References Cited

U.S. PATENT DOCUMENTS

| | | | |
|---|---|---|---|
| 2007/0275300 A1* | 11/2007 | Salot | H01G 9/016 |
| | | | 429/163 |
| 2008/0032236 A1 | 2/2008 | Wallace et al. | |
| 2008/0050656 A1 | 2/2008 | Eisenbeiser | |
| 2010/0136245 A1 | 6/2010 | Albano et al. | |
| 2011/0123852 A1 | 5/2011 | Srinivasan et al. | |
| 2011/0163909 A1 | 7/2011 | Jeong | |
| 2011/0183186 A1 | 7/2011 | Klootwijk et al. | |
| 2012/0043814 A1 | 2/2012 | Deligianni et al. | |
| 2012/0235854 A1 | 9/2012 | Testar | |
| 2013/0084476 A1* | 4/2013 | Ellis-Monaghan | H01M 2/204 |
| | | | 429/61 |
| 2013/0320455 A1* | 12/2013 | Cappellani | H01L 29/66795 |
| | | | 257/368 |
| 2013/0329373 A1 | 12/2013 | Smith et al. | |
| 2014/0038028 A1* | 2/2014 | Genard | H01M 10/0436 |
| | | | 429/152 |
| 2014/0233200 A1 | 8/2014 | Lemke et al. | |

FOREIGN PATENT DOCUMENTS

| | | |
|---|---|---|
| CN | 101065830 A | 10/2007 |
| CN | 101796654 A | 8/2010 |
| CN | 102210023 A | 10/2011 |
| CN | 102680967 A | 9/2012 |
| CN | 102707285 A | 10/2012 |
| CN | 103069580 A | 4/2013 |
| DE | 112011102716 T5 | 6/2013 |
| DE | 102014101058 A1 | 8/2014 |
| WO | 2005006391 A2 | 1/2005 |
| WO | 2006056959 A1 | 6/2006 |
| WO | 2009032986 A2 | 3/2009 |
| WO | 2010054209 A1 | 5/2010 |
| WO | 2012022512 A1 | 2/2012 |

OTHER PUBLICATIONS

Notice of Allowance issued for the U.S. Appl. No. 14/037,429, dated Aug. 2, 2017, 9 pages, (for reference purpose only).

* cited by examiner

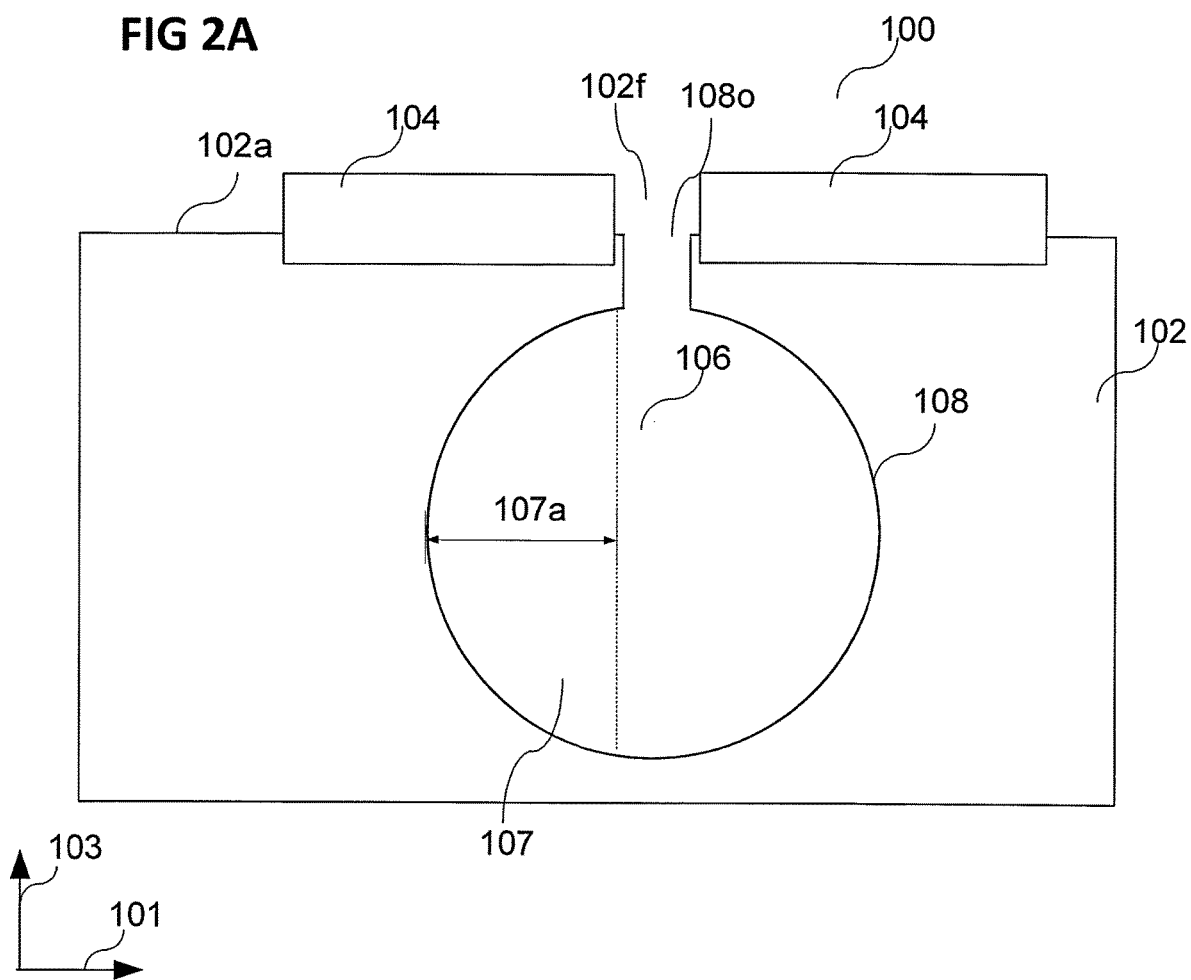

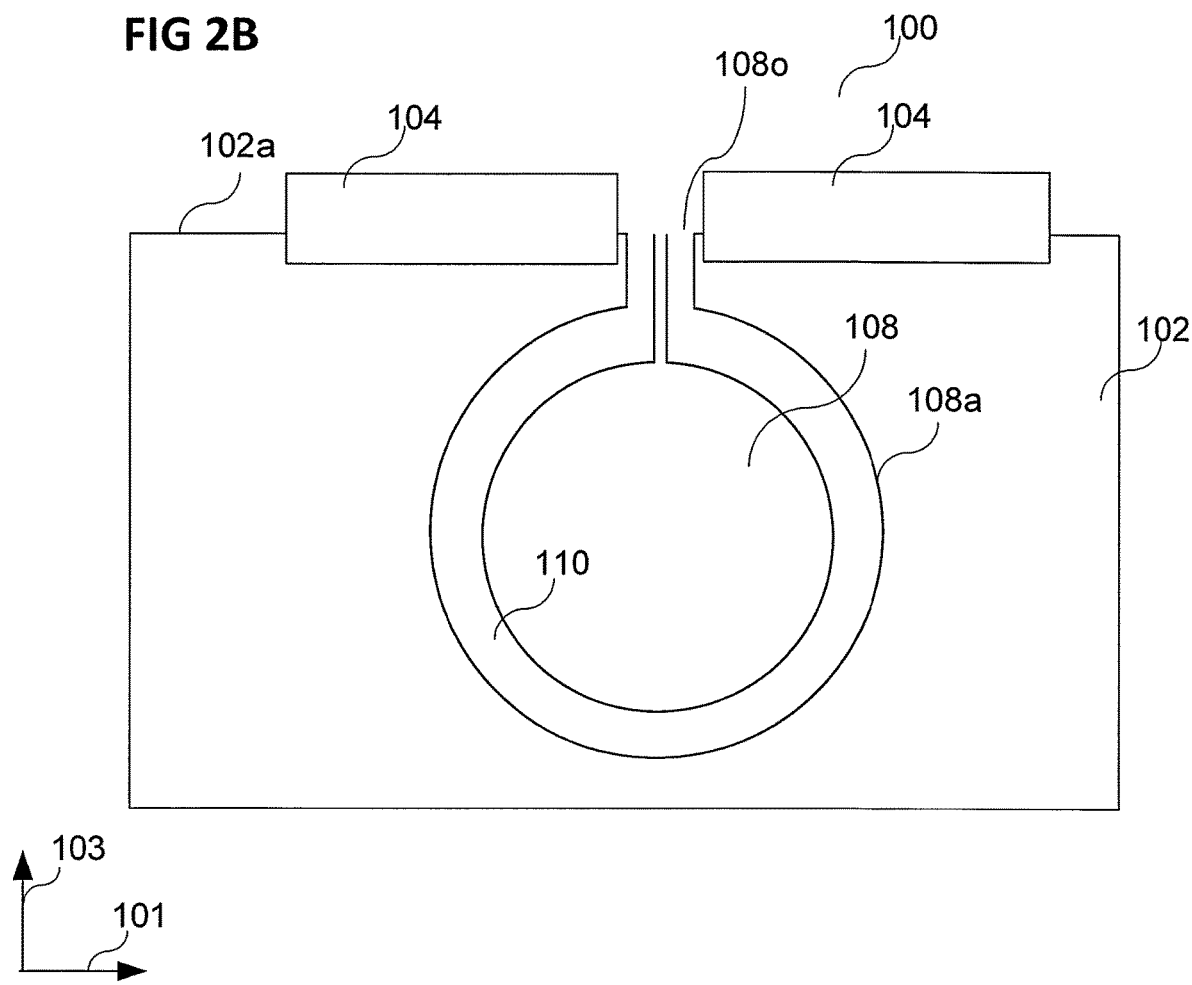

INTEGRATED CIRCUIT STRUCTURE AND A BATTERY STRUCTURE

TECHNICAL FIELD

Various embodiments relate generally to an integrated circuit structure and a to a battery structure.

BACKGROUND

In semiconductor industry a variety of processes are utilized for manufacturing electronic devices, such as integrated circuits, memory chips, sensors, and the like. Besides this, it may be desirable to develop fabrication processes for batteries, e.g. thin film batteries, using similar fabrication techniques as they are used in semiconductor industry. Current thin film deposition techniques may allow fabrication of functional layers forming a battery, or forming a rechargeable battery in thin film technology. In general, an electronic circuit being formed on a wafer or a substrate may be designed space saving, such that the electronic circuit may consume as less space on the surface of the wafer as possible or as desired for a specific design of the circuit resulting in a more efficient manufacturing process and/or an increased yield.

SUMMARY

According to various embodiments, an integrated circuit structure may include: an electronic circuit being arranged on a surface of a carrier, and a solid state electrolyte battery being at least partially arranged within the carrier, wherein at least a part of the solid state electrolyte battery being arranged within the carrier is overlapping with the electronic circuit along a direction parallel to the surface of the carrier.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 2A and 2B show respectively a schematic view of an integrated circuit structure, according to various embodiments;

FIG. 4M shows an integrated circuit structure including an electronic circuit and a solid state electrolyte battery, according to various embodiments;

DESCRIPTION

Figure 1:
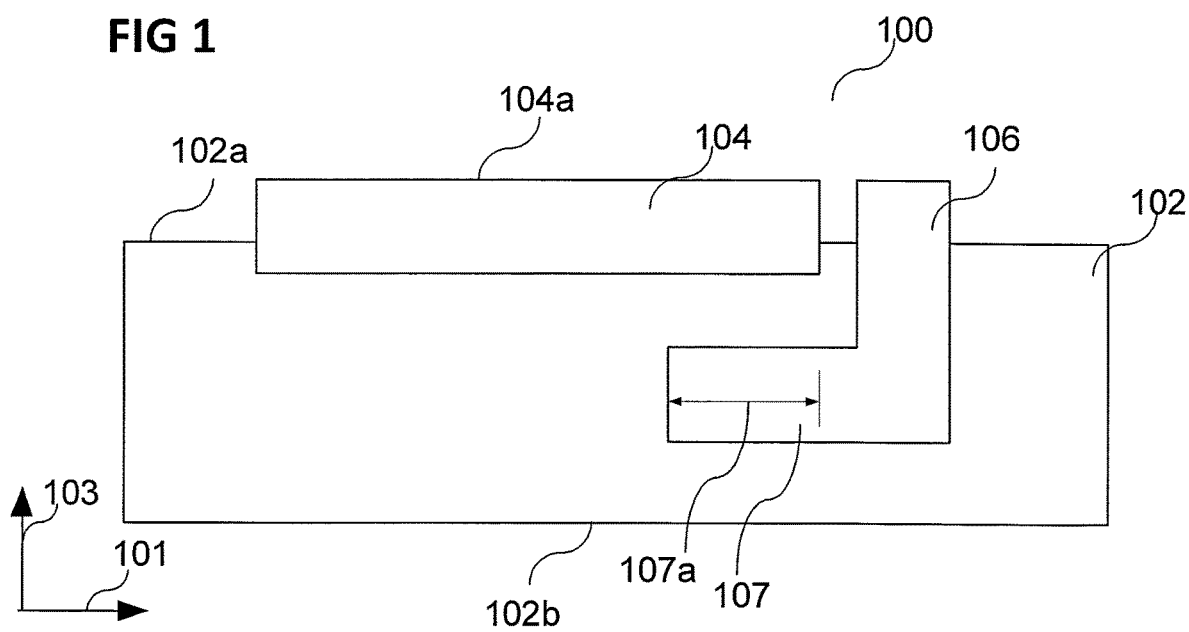
FIG. 1 shows a schematic view of an integrated circuit structure, according to various embodiments.

The following detailed description refers to the accompanying drawings that show, by way of illustration, specific details and embodiments in which the invention may be practiced.

The word "over" used with regards to a deposited material formed "over" a side or surface or deposit a layer "over" a carrier, may be used herein to mean that the deposited material may be formed "directly on", e.g. in direct contact with, the implied side, surface, or carrier. The word "over" used with regards to a deposited material formed "over" a side or surface or to deposit a layer "over" a carrier, may be used herein to mean that the deposited material may be formed "indirectly on" the implied side, surface, or carrier with one or more additional layers being arranged between the implied side, surface, or carrier and the deposited material.

The term "lateral" used with regards to the "lateral" extension of a structure (or of a carrier) or "laterally" overlapping, may be used herein to mean an extension along a direction parallel to a surface of a carrier. That means that a surface of a carrier (e.g. a surface of a substrate, or a surface of a wafer) may serve as reference, commonly referred to as the main processing surface of a wafer (or the main processing surface of another type of carrier). Further, the term "width" used with regards to a "width" of a structure (or of a structure element, e.g. a cavity) may be used herein to mean the lateral extension of a structure. Further, the term "height" used with regards to a height of a structure (or of a structure element), may be used herein to mean an extension of a structure along a direction perpendicular to the surface of a carrier (e.g. perpendicular to the main processing surface of a carrier).

The word "cover" used with regards to deposited material covering a structure (or a structure element), may be used herein to mean that a deposited material may cover a structure (or a structure element) completely, e.g. covering all exposed sides and surfaces of a structure. The word "cover" used with regards to deposited material covering a structure (or a structure element), may be used herein to mean that the deposited material may cover a structure at least partially, e.g. a material may at least partially cover the exposed sides and surfaces of a structure.

According to various embodiments, forming a layer (e.g. depositing a layer, depositing a material, and/or applying a layering process) as described herein may also include forming a layer, wherein the layer may include various sub-layers, whereby different sub-layers may include different materials respectively. In other words, various different sub-layers may be included in a layer, or various different regions may be included in a deposited layer and/or in a deposited material.

Since there may be many individual processes used in semiconductor processing (e.g. during the manufacture of an integrated circuit, a chip, or a battery, e.g. during processing a carrier or a wafer including a battery structure), usually carried out in sequence, several basic manufacturing techniques may be used at least once in the overall manufacturing process. The following description of basic techniques should be understood as illustrating examples, which techniques may be included in the processes described herein. The exemplarily described basic techniques may be not necessarily need to be construed as preferred or advantageous over other techniques or methods, since they only serve to illustrate how one or more embodiments of the invention may be practiced. For sake of brevity, the illustration of exemplarily described basic techniques may be only a short overview and should not be considered as exhaustive specification.

According to various embodiments, at least one of the following techniques may be used for manufacturing an integrated circuit structure or a battery structure, as described herein. According to various embodiments, at least one of the techniques, as described in the following, may be included in a method for manufacturing an integrated circuit structure or in a method for manufacturing a battery structure, or e.g. in a method for manufacturing an integrated circuit including a thin film battery structure, as described herein.

According to various embodiments, at least one layering or at least one layering process may be used in a method for manufacturing an integrated circuit structure or battery structure, as described herein. In a layering process, a layer (also generally referred to as film or thin film) may be deposited over a surface (e.g. over a carrier, over a wafer, over a substrate, over another layer, over a plurality of structure elements, and the like) using deposition techniques which may include chemical vapor deposition (CVD, or a CVD process) and/or physical vapor deposition (PVD, or a PVD process), according to various embodiments. The thickness of a deposited layer may be in the range of a few nanometers up to several micrometers depending on its specific function. The thickness of a deposited layer may be regarded as the spatial extension of the deposited layer along its growth direction. Thin layers in the range of a few nanometers, e.g. having a layer thickness smaller than 50 nm, may be formed using an atomic layer deposition (ALD). A conformal layer, e.g. covering the sidewalls of a structure element or covering the inner sidewalls of a cavity, may be formed using an atomic layer deposition (ALD) or another suitable conformal deposition process, as for example low pressure chemical vapor deposition (LPCVD).

According to various embodiments, a deposited (formed or provided) layer may include at least one of an electrically insulating material, an electrically semiconducting material, and/or an electrically conductive material, depending on the respective specific function of the deposited layer. According to various embodiments, electrically conductive materials, as for example aluminium, aluminium-silicon alloys, aluminium-copper alloys, copper, nichrome (an alloy of nickel, chromium, and/or iron), tungsten, titanium, titanium nitride, molybdenum, platinum, gold, carbon (graphite), or the like, may be deposited using a CVD process or a PVD process. According to various embodiments, semiconducting materials, as for example silicon (e.g. silicon, polycrystalline silicon (also referred to as polysilicon), or amorphous silicon), germanium, a semiconductor compound material such as gallium arsenide (GaAs), indium phosphide (InP), or indium gallium arsenide (InGaAs) may be deposited using a CVD process. Insulating materials, as for example silicon oxide, silicon nitride, silicon oxynitride, metal oxides (e.g. aluminum oxide), organic compounds, polymers, (or the like) may be deposited using a CVD process or a PVD process. According to various embodiments, modifications of these processes may be used as described in the following.

According to various embodiments, a chemical vapor deposition process (CVD process) may include a variety of modifications, as for example atmospheric pressure CVD (APCVD), low pressure CVD (LPCVD), ultrahigh vacuum CVD (UHVCVD), plasma enhanced CVD (PECVD), high density plasma CVD (HDPCVD), remote plasma enhanced CVD (RPECVD), atomic layer CVD (ALCVD), vapor phase epitaxy (VPE), metal organic CVD (MOCVD), hybrid physical CVD (HPCVD), and the like. According to various embodiments, silicon, polysilicon, amorphous silicon, silicon dioxide, silicon nitride, and the like may be deposited using LPCVD or ALCVD. According to various embodiments, for example platinum, titanium nitride, titanium oxide, LIPON, LLT, LTO, copper nitride, vanadium oxide, $LiFePO_4$, and $LiCoO_x$ may be deposited using atomic layer deposition (ALD or ALCVD).

According to various embodiments, a physical vapor deposition process may include a variety of modifications, as for example magnetron sputtering, ion-beam sputtering (IBS), reactive sputtering, high-power impulse magnetron sputtering (HIPIMS), vacuum evaporation, molecular beam epitaxy (MBE), and the like.

According to various embodiments, a layering process may further include thermal oxidation (also referred to as thermal oxidation process). According to various embodiments, thermal oxidation may be used to grow high quality silicon oxide layers (so-called high temperature oxide layer (HTO)) on a silicon surface, e.g. at a temperatures in the range from about 800° C. to about 1200° C. The thermal oxidation may be performed at atmospheric pressure or at high pressure and as further modification as a rapid thermal oxidation process (RTO). According to various embodiments, also thermal nitridation may be applied to generate high quality nitride or oxynitride layers (e.g. silicon nitride layers or silicon oxynitride layers), e.g. using rapid thermal nitridation (e.g. at temperatures up to about 1300° C.).

Further, according to various embodiments, a process which may be applied to generate a metal layer may be plating, e.g. electroplating or electroless plating. According to various embodiments, a plating process may be used for forming a metallization layer structure or a metallization. According to various embodiments, a metallization layer may include for example one or more metal lines and one or more vias connecting several structures or structure elements on a carrier, e.g. connecting a battery and an electronic circuit being arranged on a carrier.

It should be noted, that a variety of combinations of materials and processes may be used in a layering process, according to various embodiments. Depending on specific aspects or desired properties of the layer to be formed, as for example crystalline quality, surface roughness, edge covering behavior, growth speed, and yield, the most suitable process may be applied for the respective material, according to various embodiments.

According to various embodiments, some processes during manufacture of an integrated circuit may require a conformally deposited layer or conformally depositing a layer (e.g. for forming a layer stack over a sidewall of a structure element or over an inner sidewall of a cavity), which means that a layer (or a material forming a layer) may exhibit only small thickness variations along an interface with another body, e.g. a layer may exhibit only small thickness variations along edges, steps or other elements of the morphology of the interface. According to various embodiments, layering processes such as plating, atomic layer deposition (ALD), or several CVD processes (e.g. ALCVD, or LPCVD) may be suitable to generate a conformal layer or a conformally deposited layer of a material. According to various embodiments, using for example an atomic layer deposition (ALD) process, a structure having a high aspect ratio (e.g. larger than 5, e.g. larger than 10, e.g.

larger than 20) may be conformally covered with a conformal layer or conformal thin film. Further, according to various embodiments, using for example an atomic layer deposition (ALD) process, the inner sidewall of a cavity or of a hollow chamber may be covered (completely or partially) with a conformal layer or a conformal thin film. In other words, using atomic layer deposition may allow coating the inner sidewall of a cavity or a cavity structure with a material layer (e.g. with a conformal material layer), if the cavity or the cavity structure may have at least one opening such that the material forming the material layer may reach the interior of the cavity or the cavity structure.

According to various embodiments, at least one patterning or at least one patterning process may be used for forming an integrated circuit structure or a battery structure, as described herein. At least one patterning or at least one patterning process may be used in a method for manufacturing an integrated circuit structure or in a method for manufacturing a battery structure, as described herein. A patterning process may include removing selected portions of a surface layer or of a material. After a surface layer may be partially removed, a pattern (or a patterned layer or patterned surface layer or a plurality of structure elements) may remain at least one of over and in the subjacent structure (e.g. a patterned base layer may remain on a subjacent structure). Since a plurality of processes may be involved, according to various embodiments, there are various possibilities to perform a patterning process, wherein aspects may be: selecting at least one portion of a surface layer (or at least one portion of a material, or at least one portion of a wafer) which shall be removed, e.g. via at least one lithographic process; and removing the selected portions of a surface layer, e.g. via at least one etch process.

According to various embodiments, a variety of lithographic processes may be applied generating a lithographic mask (a so-called photomask), as for example photolithography, microlithography or nanolithography, electron beam lithography, X-ray lithography, extreme ultraviolet lithography (EUV or EUVL), interference lithography, and the like. A lithographic process may include at least one of an initial cleaning process, a preparation process, applying a resist (e.g. a photoresist), exposing the resist (e.g. exposing the photoresist to a pattern of light), developing the resist (e.g. developing the photoresist using a chemical photoresist developer).

An initial cleaning process or a cleaning process, which may be included in a lithographic process (or which may be included in a general process in semiconductor processing), may be applied to remove organic or inorganic contaminations (or material) from a surface (e.g. from a surface layer, from a carrier, from a wafer, and the like) for example via wet chemical treatment. The initial cleaning process or a cleaning process may include at least one of the following processes: RCA (Radio Corporation of America) cleaning (also known as Organic Clean (SC1) and Ionic Clean (SC2)); SCROD (single-wafer spin cleaning with repetitive use of ozonized water and diluted HF); IMEC wafer cleaning; post chemical mechanical polishing (post-CMP) cleaning process; cleaning via de-ionized water (DIW), piranha etch and/or a metal etch; (and the like). According to various embodiments, a cleaning process may also be applied for removing a thin oxide layer (e.g. a thin silicon oxide layer) from a surface (e.g. from a surface layer, from a carrier, or from a wafer, and the like).

According to various embodiments, a preparation process, which may be included in a lithographic process, may be applied to promote the adhesion of the photoresist to a surface (e.g. to a surface layer, to a carrier, or to a wafer, and the like). The preparation process may include applying a liquid or gaseous adhesion promoter (e.g. bis(trimethylsilyl) amine (HMDS)).

A resist, which may be included in a lithographic process, may be applied to cover a surface (e.g. a surface layer, a carrier, or a wafer, and the like) homogeneously. Applying a resist may include spin coating to generate a thin layer of the resist. Afterwards, a resist may be prebaked to drive off excess resist solvent, according to various embodiments. Several types of resists (e.g. a photoresist) may be used adapted to the process of exposing the resist to achieve desired results. Positive photoresists (e.g. DNQ-Novolac, PMMA, PMIPK, PBS, and the like) may be used, and/or negative photoresists (e.g. SU-8, poly isoprene, COP, and the like) may be used.

According to various embodiments, a lithographic process may include exposing a resist so that a desired pattern may be transferred to the resist, e.g. by using light or electrons, wherein the desired pattern may be defined by a patterned mask (e.g. a glass carrier with a patterned chromium layer). Mask-less lithography may be applied, wherein a precise beam (e.g. an electron beam or a laser beam) may be projected without using a mask directly onto the surface including the resist. The wavelength of the used light may range from the wavelength of the visible light to a smaller wavelength in the ultra violet range. The exposure may be performed using X-rays or electrons having even a shorter wavelength than ultra violet light. Projection exposure systems (steppers or scanners) may be used projecting the mask many times onto a surface including a resist to create the complete exposure pattern.

A lithographic process may include developing a resist (e.g. developing a photoresist using a photoresist developer), to partially remove the resist generating a patterned resist layer remaining on the surface (e.g. on a surface layer or on a carrier, a wafer, and the like). Developing a resist may include a post exposure bake (a heat treatment, e.g. rapid thermal processing) before the actual developing process may be performed. The developing process may include a chemical solution (a so-called developer) as for example sodium hydroxide or tetramethylammonium hydroxide (TMAH, a metal ion free developer). According to various embodiments, the remaining patterned resist may be solidified in a hard bake process (a heat treatment, e.g. rapid thermal processing), realizing a more durable protecting layer for later processes as for example ion implantation, wet chemical etching, or plasma etching (and the like).

Independently of the described lithographic processes, a resist may be removed completely at a desired processing stage (e.g. after at least one of an etch process, ion implantation process, and a deposition process have been performed) in a so-called resist strip process. A resist may be removed chemically and/or by using oxygen plasma.

It should be noted, that a lithographic process, including applying a resist, exposing a resist, and developing a resist may also be considered as a patterning process, wherein a patterned resist layer (a soft mask, or a resist mask) may be generated by the lithographic process. Subsequently, a pattern may be transferred from a patterned resist layer to a previously deposited or grown layer (or a carrier, and the like) using an etch process, wherein the previously deposited or grown layer may include a hard mask material as for example an oxide or a nitride (e.g. silicon oxide, e.g. silicon nitride) creating a so-called hard mask.

According to various embodiments, an etch process, which may be included for example in a patterning process or which may be used for forming a cavity and/or a recess, may be applied to remove material from a previously deposited layer, a grown surface layer, a carrier (or substrate, or wafer), and the like. An etch process may be adapted and performed depending on the specific requirements for the desired process. An etch process may include a wet etch process and/or a dry etch process. An etch process may be selective or non-selective with respect to two different materials or may be configured to be selective or non-selective, wherein a selective etch process may provide a different etching rate for a first material than for a second material and a non-selective etch process may provide the same etching rate for a first material and a second material. An etch process may be isotropic or anisotropic or may be configured to be isotropic or anisotropic, wherein an anisotropic etch process may have different etching rates along different spatial directions and an isotropic etch process may have the same etching rates along all spatial directions. An etch process may be anisotropic due to different etching rates along different crystallographic directions of the material to be etched. An etch process using a masking material and a dry etch process (e.g. plasma etching or reactive ion etching) may allow forming anisotropic structures, e.g. recesses.

According to various embodiments, a selective etch process may include a specific etchant (e.g. a wet etchant, e.g. a plasma etchant) which may allow etching at least one desired material while sparing another material, e.g. an exposed region of a layer or carrier may be removed (etched) while a mask material (or another material) may remain. Silicon dioxide may be removed (etched) selectively compared to silicon by using hydrofluoric acid ($HF_{aq}$) as etchant. Silicon dioxide may be removed (etched) together with silicon (non-selectively) by using a mixture of nitric acid and hydrofluoric acid ($HNO_3/HF_{aq}$) as etchant.

According to various embodiments, an anisotropic wet etch process may reveal a different etching rate along a respective crystallographic direction of a specific material. A wet etch process including potassium hydroxide (KOH) as etchant may be performed to etch silicon (e.g. a silicon wafer) anisotropically. A wet etch process including ($HNO_3/HF_{aq}$) as etchant may be performed to etch silicon (e.g. a silicon wafer) isotropically. An anisotropic dry etch process may reveal a different etching rate for surfaces with a specific geometric alignment. A physical etch process may be applied (e.g. ion beam milling, e.g. plasma etching) to perform an anisotropic removal of a material.

Further, to create at least one of a deep penetration, a steep-sided hole, and a trench in a material (e.g. in a wafer, in a substrate, in a deposited or grown layer, and the like) deep reactive-ion etching (DRIE) may be applied. A pulsed etching (time-multiplexed etching) may be applied.

According to various embodiments, a patterned layer may also serve as a mask (a so-called hard mask) for other processes like etching, ion implantation, and/or layering. Further, a patterned photoresist may also serve as a mask (a so-called soft mask). The mask material may usually be selected with regard to specific needs as for example chemical stability, e.g. to perform a selective etch process which does not affect the mask material (e.g. which may not etch away the mask material completely), or mechanical stability, e.g. to protect regions from being penetrated by ions, or to define the shape of generated structure elements during a layering process, and the like.

According to various embodiments, at least one doping process may be used for forming an integrated circuit structure, as described herein. At least one doping process may be included in a method for manufacturing an integrated circuit structure, as described herein. Various techniques may be applied or may be adapted to perform a doping process, as for example thermal diffusion and/or ion implantation. Electron doped material may be called n-type (negative-type) and hole doped material may be called p-type (positive type). In metal-oxide-semiconductor technology (MOS-technology) a channel may include electrons (n-channel, or nMOS) or holes (p-channel or pMOS) and in analogy, a metal-oxide-semiconductor field-effect transistor (MOSFET) may include an n-channel (nMOSFET) or a p-channel (pMOSFET).

According to various embodiments, a heat treatment may be applied for forming an integrated circuit structure or a battery structure; or a heat treatment may be included in various processes (or at various process stages) during manufacture of an integrated circuit structure or a battery structure, as described herein, e.g. in combination with a patterning process, after applying photoresist, and/or after depositing electrical contacts to alloy the electrically conductive material (e.g. a metal) with a carrier (or with the subjacent structure), or to provide optimal deposition conditions for a layering process. The heating of a carrier (a wafer, a substrate, and the like) may be performed with direct contact, e.g. a hot plate, or by radiation, e.g. using a laser or lamps. A rapid thermal processing (RTP) may be applied, which may be performed under vacuum conditions using a laser heater or lamp heater, wherein a material (e.g. a wafer, a substrate, a carrier, and the like) may be heated up to several hundred degrees Celsius or up to about 1000° C. or even greater within a short time period, e.g. within several seconds (e.g. about 1 s to about 10 s). Subsets of rapid thermal processing are rapid thermal annealing (RTA) and rapid thermal oxidation (RTO).

At least one metallization process may be applied in a method for manufacturing an integrated circuit structure or a battery structure. A metallization may be in direct contact with at least one structure element of an electronic circuit (or with at least one structure on a carrier), wherein a metallization process may realize required electrical connections (or interconnections) for the at least one structure element of an electronic circuit and or a battery being integrated into a carrier. A metallization process may include at least one layering process and at least one patterning process. A metallization process may include depositing a layer of a dielectric material (e.g. a low-k dielectric material, e.g. undoped silicate glass, and the like), forming contact holes at the desired locations (e.g. using at least one patterning process), and filling the contact holes with at least one electrically conductive material (e.g. with at least one of a metal (e.g. aluminium, copper, tungsten, titanium, molybdenum, gold, platinum, and the like), a metallic material (e.g. titanium nitride, platinum silicide, titanium silicide, tungsten silicide, molybdenum silicide, and the like), electrically conductive polysilicon, and a metal alloy (e.g. aluminium-silicon alloys, aluminium-copper alloys, aluminium-silicon-copper alloys, nichrome, titanium-tungsten alloys, and the like)) using a layering process. Further, a metallization process (or a metallization process) may include forming additional layers for example as a barrier (e.g. including at least one of molybdenum, a transition metal nitride (e.g. titanium nitride), platinum silicide, titanium silicide, tungsten silicide, molybdenum silicide, borides, and the like), or as adhesion promoter (e.g. including at least one of platinum silicide, titanium silicide, tungsten silicide, molybdenum silicide, and the like).

According to various embodiments, applying a metallization process may further include a planarization of a carrier surface (wafer surface, substrate surface, and the like) and/or a planarization of intermediate layers included in a multilevel metallization process (e.g. using chemical mechanical polishing).

A planarization process may be applied for example to reduce the surface roughness or to reduced variations in the depth profile of a surface of a carrier including structure elements having different heights, since some processes may require a flat surface (a planar surface) (e.g. high resolution lithography). A planarization process may be desired as the number of performed layering processes and patterning processes increases and as a planar surface may be required. A chemical mechanical polishing process (CMP or CMP process) may be performed, wherein this process may be selective to specific materials on the surface of a carrier (of a wafer, substrate, surface layer, and the like). A chemical mechanical polishing process (CMP) may be performed, wherein this process may be non-selective to specific materials on the surface of a carrier (of a wafer, substrate, surface layer, and the like). A planarization process may be included additionally in several processes, e.g. in layering processes, patterning processes, and the like. A chemical mechanical polishing process (CMP) may be used to remove a surface layer or a part of a surface layer.

According to various embodiments, a carrier (e.g. a substrate, a wafer, and the like) may be made of semiconductor materials of various types, including silicon, germanium, Group III to V or other types, including polymers, for example, although in another embodiment, other suitable materials can also be used. The wafer substrate may be made of silicon (doped or undoped), in an alternative embodiment, the wafer substrate may be a silicon on insulator (SOI) wafer. As an alternative, any other suitable semiconductor materials can be used for the wafer substrate, for example semiconductor compound material such as gallium arsenide (GaAs), indium phosphide (InP), but also any suitable ternary semiconductor compound material or quaternary semiconductor compound material such as indium gallium arsenide (InGaAs). A carrier may include a coated structure, e.g. a metal tape coated with silicon, and the like. A carrier may further include a polymer, a laminate, or a metal.

Integrating a battery into an electronic circuit (or integrating a battery into a semiconductor device) may be beneficial for a variety of devices or integrated circuits. Further, in many applications it may be desirable to integrate an energy storage unit directly into an integrated circuit or into an electronic circuit. Electric potential energy may be stored physically, as for example in a capacitor, or in electrochemical form, as for example in a battery or in a rechargeable battery, wherein highest energy densities are obtained with both, very thin active layers and very large areas of thus active layers. According to various embodiments, to achieve the desired energy density and to keep the required footprint of an energy storing structure small, the electrochemical energy may be stored in a battery structure being arranged within a carrier below the electronic circuit, as described herein, using for example patterning techniques as provided by semiconductor technology for manufacturing the battery structure. Illustratively, an integrated circuit structure including a battery may be provided and/or a battery structure may be provided in the following, according to various embodiments, wherein the footprint of the battery structure on the wafer surface may be small compared to the area of the active battery layers of the battery structure, thereby, a battery with a large energy storage capacity may be provided being efficiently integrated together with an electronic circuit on a carrier. Further, illustratively described, an integrated circuit structure may be provided, the integrated circuit structure including a carrier and an electronic circuit, wherein the unused space in the carrier below an electronic circuit may be used to provide a battery structure with a high energy storage capacity compared to the required space on the main processing surface of the carrier. According to various embodiments, an integrated circuit structure may be provided, the integrated circuit structure including a carrier and an electronic circuit, wherein a battery structure is provided close to the electronic circuit having a high energy storage capacity.

According to various embodiments, a battery structure may be provided within a carrier, such that the energy storage capacity of the battery structure may be large compared to the required area on the main processing surface of the carrier. Additional structures may be provided on the main processing surface of the carrier laterally overlapping with the battery structure or at least a part of the battery, wherein the additional structures may not be affected by the subjacent battery structure.

In general, a rechargeable battery may include at least two electrodes, a separator and an electrolyte, which may include for example lithium-ions. To store energy in a rechargeable lithium-ion based battery, lithium-ions may be chemically bound to the negative electrode.

In case, that the rechargeable battery may include a solid state electrolyte, the electrolyte itself may have the function of the separator, such that an additional separator or an additional separator layer may not be necessary.

According to various embodiments, to achieve electronic conductivity of the battery, at least two current collectors may be required, e.g. respectively adjoining at the two electrodes. A current collector for a battery may include an electronic conductor having a high electrical conductivity, like for example Cu, TiN, Pt, Al, AlCu, W, Au.

Further, in case of integrating a lithium battery into an electronic circuit the lithium, e.g. included in the layers forming the battery, may be separated from other electronic components, e.g. via a barrier layer or a barrier structure to prevent lithium diffusion. According to various embodiments, a lithium barrier may be for example a conformally deposited (close and dense) layer or thin film including at least one material of the following group of materials: titanium nitride, tungsten nitride, and silicon nitride. According to various embodiments, the barrier function and the current collection function may be combined in a single layer, e.g. by providing an electrically conductive barrier layer including for example titanium nitride.

In the following, an integrated circuit structure may be provided including an integrated rechargeable battery and a method may be provided for manufacturing an integrated circuit structure including an integrated rechargeable battery. Further, a battery structure may be provided and a method may be provided for manufacturing a battery structure.

An integrated rechargeable battery may be provided, wherein forming the integrated rechargeable battery may include semiconductor technology. An on board battery may be integrated into an integrated circuit structure in a simple and easy way, wherein the manufacturing costs may be reduced compared to commonly used manufacturing processes. A method for manufacturing an integrated circuit structure or the method for manufacturing a battery structure, as described herein, may be easily adapted to create similar and/or modified structures, since the method may be integrated into any semiconductor technology. A battery included in the integrated circuit structure may be formed after the electronic circuit included in the integrated circuit structure has been formed, and therefore, there may be no limitations for forming the electronic circuit due to the thermal stability of the used active battery layers, e.g. forming a CMOS structure after the battery has been formed may destroy the battery due to high temperatures being desired in CMOS technology during the manufacturing process, or a processing temperature during forming the electronic circuit may be limited by the thermal stability of the battery.

FIG. 1 illustrates an integrated circuit structure 100, according to various embodiments; the integrated circuit structure 100 may include a carrier 102, an electronic circuit 104 and a battery 106. The carrier 102 may be a semiconductor wafer or a semiconductor substrate, as already described, e.g. a silicon wafer or a silicon substrate. The electronic circuit 104 may be formed at least one of over an in the carrier 102. Further, the electronic circuit 104 may be arranged at least one of over and in a main processing surface 102a (e.g. a first surface) of the carrier 102. The electronic circuit 104 may be arranged for example on a main processing surface 102a (e.g. a first surface) of the carrier 102. The battery 106 may be formed and/or may be arranged at least partially within the carrier. At least a part 107 of the solid state electrolyte battery 106 (the battery 106), may overlap with the electronic circuit 104 along a direction 101 parallel to the surface 102a of the carrier 102, e.g. along a direction parallel to the main processing surface 102a of the carrier 102. According to various embodiments, the part 107 laterally overlapping with the electronic circuit 104 may be arranged within the carrier 106.

According to various embodiments, the electronic circuit 104 may include at least one of the following basic semiconductor structures: a MOS-structure (metal oxide semiconductor structure), an nMOS-structure (n-channel MOS-structure), a pMOS-structure (p-channel MOS-structure), a CMOS-structure (complementary metal oxide semiconductor structure). Further, according to various embodiments, the electronic circuit 104 may include or may be a part of (or may provide a part of) at least one of the following components: a chip, a memory chip, a die, a microprocessor, a microcontroller, a memory structure, a charge storage memory, a random access memory, a dynamic random access memory, a logic circuit, a sensor, a nanosensor, an integrated transceiver, a micro-mechanical device, a microelectronic device, a nano-electronic device, an electrical circuit, a digital circuit, an analog circuit, and any other electronic device based on semiconductor technology, as for example a radio-frequency identification (RFID) chip and a chip card module.

Further, a memory structure (e.g. the memory structure included in the electronic circuit 104) may include at least one of the following: a volatile memory, a DRAM (dynamic random access memory) or a non-volatile memory, a PROM (programmable read only memory), an EPROM (erasable PROM), an EEPROM (electrically erasable PROM), a flash memory, a floating gate memory, a charge trapping memory, an MRAM (magnetoresistive random access memory), a CBRAM (conductive bridge random access memory), and a PCRAM (phase change random access memory).

The electronic circuit 104 may include at least one electronic component of the following group of electronic components: a resistor, a capacitor, an inductor, a transistor (for example, a field effect transistor (FET) (e.g. a metal oxide semiconductor field effect transistor (MOSFET), a fin field effect transistor (FinFET), or a floating gate transistor), a power transistor, a bipolar transistor, an insulated gate bipolar transistor (IGBT)), a test structure, and any other electronic component based on semiconductor technology.

The battery 106 may include at least one type of the following type of batteries: a thin film battery 106, a solid state electrolyte battery 106, a rechargeable lithium-ion based battery 106, a rechargeable lithium-ion based thin film battery 106, a rechargeable lithium-ion based solid state electrolyte battery, a rechargeable lithium-ion based solid state electrolyte thin film battery, and the like. Further, the battery 106 may include a nickel-metal hydride battery, e.g. a rechargeable nickel-metal hydride battery, e.g. a nickel-metal hydride thin film battery.

A thin film battery, as described herein, may include a layer stack (a battery layer stack) including the active battery layers, e.g. at least one of a cathode layer, an electrolyte layer, an anode layer, an anode current collector layer and a cathode current collector layer. The battery 106 may include a layer stack being disposed over an inner surface of a cavity being formed in the carrier 102, wherein at least a part of the cavity formed within the carrier 102 may overlap with the electronic circuit 104 along a direction 101 parallel to the surface 102a of the carrier 102. Therefore, the battery 106 may consume a surface area at the surface 102a of the carrier 102 being smaller than the surface area of each of the active battery layers.

According to various embodiments, the battery 106 may be electrically connected to the electronic circuit 104 or at least to a component of the electronic circuit 104 (not shown). The integrated circuit structure 100 may further include a metallization structure electrically conductively connecting the battery 106 with the electronic circuit 104. The metallization structure coupling the battery 106 with the electronic circuit 104 may be arranged at least partially on top of the electronic circuit 104, e.g. at least partially over the upper surface 104a of the electronic circuit 104.

According to various embodiments, the bigger part of the battery 106 may be arranged within the carrier 102, e.g. more than 50% of the active battery layers included in the battery 106 may be arranged within the carrier 102 (e.g. below the main processing surface 102a of the carrier 102).

According to various embodiments, the carrier 102 may have a first side 102a, wherein the electronic circuit 104 may be arranged on said first side 102a, and a second side 102b, opposite to the first side 102a, wherein the battery 106 (e.g. the solid state electrolyte battery 106) may be arranged at least partially (e.g. part 107 of the battery 106, as shown in FIG. 1) between the electronic circuit 104 and the second side 102b of the carrier 102. In other words, the battery 106 may extend into the carrier 102, wherein at least a part 107 of the battery 106 may be arranged below the electronic circuit 104 having an overlapping distance 107a, as shown in FIG. 1. As described herein, according to various embodiments, the overlapping distance 107a may be parallel to the surface 102a of the carrier 102; therefore, the integrated circuit structure 100 may be configured such that the battery 106 may overlap with the electronic circuit 104 along a direction parallel to the surface 102a of the electronic circuit 104.

According to various embodiments, since the carrier 102 may have a lateral extension along the direction 101, the battery 106 may at least laterally overlap with the electronic circuit 104, which may imply, that the surface region of the surface 102a of the carrier 102 at least over a part 107 of the battery 106 may be used for disposing a desired structure, e.g. an electronic circuit 104, a sensor 104, an electromicromechanical device 104 and/or a micromechanical device 104.

According to various embodiments, the part 107 of the battery 106 being arranged below the electronic circuit 104 may be electrically connected to the electronic circuit 104. Further, the integrated circuit structure 100 may be configured such that the battery 106 may store energy to operate the electronic circuit 104.

As illustrated in FIG. 2A, the battery 106 may be formed within a cavity 108, wherein the cavity 108 may extend from the first surface 102a of the carrier 102 into the carrier 102. The cavity 108 may have at least one cavity opening 108o at the first surface 102a of the carrier 102. As shown in FIG. 2A, the diameter of the cavity 108 may be larger than the diameter of the cavity opening 108o of the cavity 108 at the surface 102a of the carrier 102 (e.g. an extension of the cavity 108 along a direction parallel to the surface 102a of the carrier 102 may be larger than an extension of the cavity opening 108o of the cavity 108 along the same direction parallel to the surface 102a of the carrier 102).

At least a part of the cavity 108 may overlap with an electronic circuit 104 being arranged on the surface 102a of the carrier 102 along a direction parallel to the surface 102a of the carrier 102 (least a part of the cavity 108 may laterally overlap with at least a part of the electronic circuit 104). Therefore, as the battery 106 may be formed within the cavity 108, at least a part 107 of the battery 106 being arranged within the cavity 108 may overlap with an electronic circuit 104 being arranged on the surface 102a of the carrier 102, as already described.

As illustrated in FIG. 2B, a layer stack 110 may be formed over the inner surface (sidewall or wall) 108a of the cavity 108, wherein the layer stack 110 may include the functional layers providing the battery 106. In other words, the inner surface 108a of the cavity 108 may be covered (or coated) with a plurality of material layers providing the thin film solid state electrolyte battery 106. The integrated circuit structure 100, as described herein, may include a plurality of cavities 108 being arranged in the carrier 102, wherein a battery 106 may be included in each cavity 108 of the plurality of cavities 108.

At least a part of the cavity 108 may overlap with an electronic circuit 104 being arranged on the surface 102a of the carrier 102, and therefore, at least a part of the layer stack 110 being formed over the inner surface 108a of the cavity 108 may overlap with the electronic circuit 104 being arranged on the surface 102a of the carrier 102 (e.g. at least a part of the layer stack 110 formed within the cavity 108 in the carrier 102 may laterally overlap with at least a part of the electronic circuit 104). According to various embodiments, the battery 106 formed within the cavity 108 may include a layer stack 110, as described in more detail referring to FIG. 5A and FIG. 5B.

Further, according to various embodiments, the battery 106 or the layer stack 110 may be electrically coupled with at least part of the electronic circuit 104, e.g. through the opening 108a of the cavity 108. According to various embodiments, the integrated circuit structure 100 may include a battery 106 or a layer stack 110 being electrically coupled with at least part of the electronic circuit 104. Electrically coupled, as referred to herein, may include coupled via an electrically conductive metallization structure or inductively coupled, e.g. via one or more coils or antenna structures (not shown).

According to various embodiments, the layer stack 110 may include at least one cathode layer, at least one anode layer, and at least one electrolyte layer, the at least one electrolyte layer being arranged between the at least one cathode layer and the at least one anode layer. The layer stack 110 may further include an anode current collector layer adjoining the at least one anode layer and a cathode current collector layer adjoining the at least one cathode layer. At least one of the anode current collector layer and the cathode current collector layer may be electrically coupled to at least a part of the electronic circuit 104, e.g. through the at least one opening 108a of the cavity 108.

An electrically insulating layer may be disposed between the material of the carrier 102 and the material forming the solid state electrolyte battery 106, e.g. between the carrier 102 and the layer stack 110. The electrically insulating layer being disposed between the carrier 102 and the battery 106 may electrically separate the battery 106 form the carrier 102, e.g. in case the carrier 102 may be electrically conductive and/or the carrier 102 may include an electrically conductive material. Further, according to various embodiments, the electrically insulating layer being disposed between the carrier 102 and the battery 106 may include a barrier layer or may be configured as a barrier layer, preventing or reducing a material transfer, e.g. due to diffusion, between the carrier 102 and the battery 106 (or the layer stack 110) or between the electronic circuit 104 and the battery 106.

The layer stack 110 may be conformally disposed over the inner surface 108a (or inner sidewall 108a) of the cavity 108. Each layer included in the layer stack 110 may be conformally disposed over the inner surface 108a of the cavity 108. Illustratively, the layer stack 110 may have a similar shape as the inner surface 108a of the cavity 108, since each layer of the layer stack 110 may be for example formed using a conformal deposition process, e.g. ALD or ALCVD.

The cavity 108 formed in the carrier 102 may have another shape, as shown in the figures. The shape of the cavity 108 may include at least one shape of the following group of shapes: a cylindrical shape, a spherical shape, a prismatic same, cubic shape, a conoid shape, or any other suitable shape, e.g. the shape of a rotational solid. The shape of the cavity 108 may be adapted to provide a large inner surface 108a while having a small opening 108a at the surface 102a of the carrier 102. Therefore, the cavity 108 may also have an asymmetric shape. Further, the cavity 108 may include a plurality of cavities being connected with each other, and therefore, providing a connected inner surface 108a. The layer stack 110 may be conformally disposed over a connected inner surface 108a of a plurality of cavities 108 being arranged in the carrier 102 having at least one opening 108a at the surface 102a of the carrier 102.

The layer stack 110 may be conformally deposited through the at least one opening 108a at the surface 102a of the carrier 102. The opening 108a may have a small footprint 102f, such that the surface area of the carrier 102 being available for the electronic circuit 104 may be as large as possible.

Figure 3:
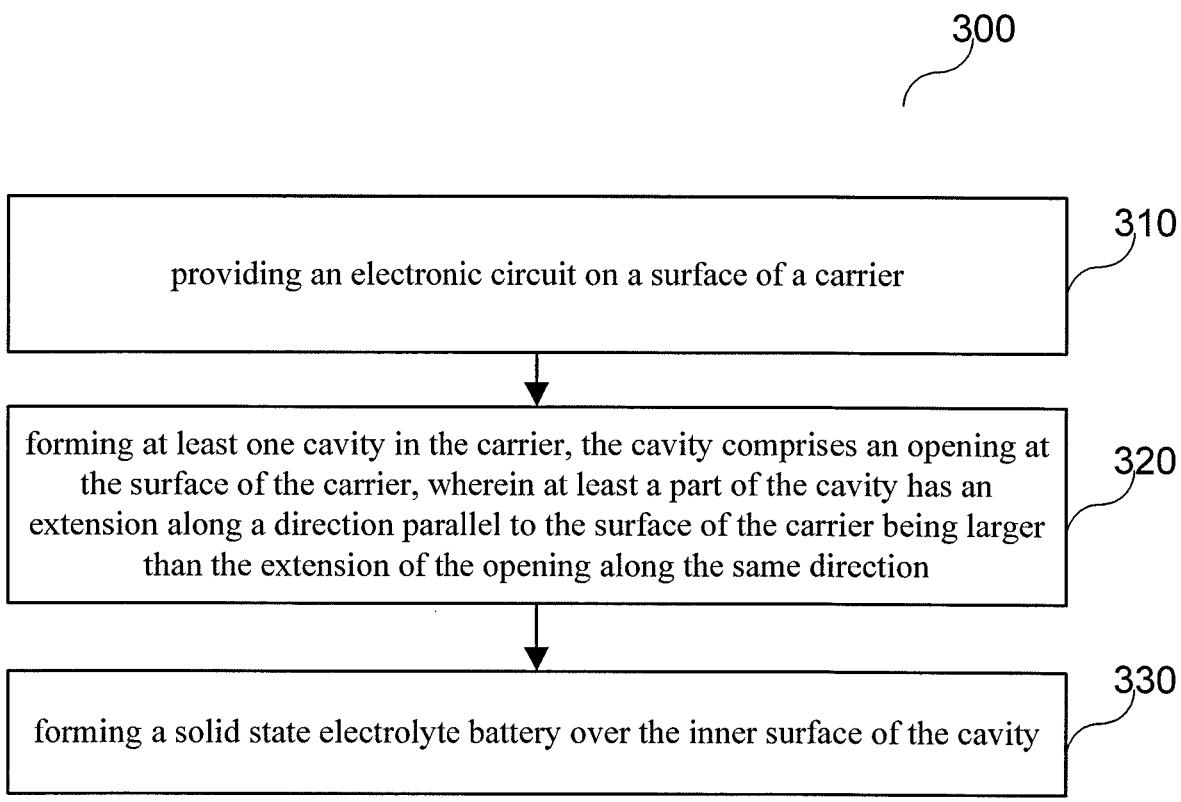
FIG. 3 shows a method for manufacturing an integrated circuit structure in a flow diagram, according to various embodiments.

FIG. 3 illustrates a flow diagram of a method for manufacturing an integrated circuit structure 100, according to various embodiments. The method may include, in 310, providing an electronic circuit 104 on a surface 102a of a carrier 102; in 320, forming at least one cavity 108 in the carrier 102, the cavity including a cavity opening 108o at the surface 102a of the carrier 102, wherein at least a part of the cavity 108 has an extension along a direction 101 parallel to the surface 102a of the carrier 102 being larger than the extension of the cavity opening 108o along the same direction; and, in 330, forming a solid state electrolyte battery 106 over the inner surface 108a of the cavity 108.

According to various embodiments, providing an electronic circuit 104 may include providing at least one electronic component of the following group of electronic components, the group including: an integrated circuit, a sensor structure, a micromechanical device, an electro optical structure, a transistor, an inductor, a capacitor, a transmitter, and a transceiver.

Process 310, including providing an electronic circuit 104 on a surface 102a of a carrier 102, may be applied for creating (or forming) the electronic circuit 104, as already described, wherein the electronic circuit 104 may include at least one of the following basic semiconductor technologies: MOS-technology (metal oxide semiconductor technology), nMOS-technology (n-channel MOS-technology), pMOS-technology (p-channel MOS-technology), CMOS-technology (complementary metal oxide semiconductor technology).

Process 310, including providing an electronic circuit 104 on a surface 102a of a carrier 102, may include at least one process of the following processes: one or more layering processes, one or more patterning processes, one or more doping processes, one or more thermal treatments, one or more cleaning processes, one or more polishing processes, and any other desired (or necessary) semiconductor process, e.g. forming a metallization structure (e.g. one or more metallization processes).

Process 310 may include forming or at least partially forming at least one of the following: a chip, a memory chip, a die, a microprocessor, a microcontroller, a memory structure, a charge storage memory, a random access memory, a dynamic random access memory, a logic circuit, a sensor, a nanosensor, an integrated transceiver, a micro-mechanical device, a micro-electronic device, a nano-electronic device, an electrical circuit, a digital circuit, an analog circuit, and any other electronic device based on semiconductor technology.

Forming an electronic circuit, e.g. in process 310 (as shown in FIG. 3), may include forming at least one electronic component of the following group of electronic components: a resistor, a capacitor, an inductor, a transistor (for example, a field effect transistor (FET) (e.g. a metal oxide semiconductor field effect transistor (MOSFET), a fin field effect transistor (FinFET), or a floating gate transistor)), a test structure, and any other electronic component based on semiconductor technology.

Forming a cavity 108 may include forming the cavity 108, as already described referring to FIG. 2A and FIG. 2B, or as described in the following. Forming a cavity 108 may include at least one of the following: a layering process, forming a mask material layer using at least a layering process, forming a hard mask, forming a soft mask, a patterning process, a lithographic process, an etch process, and other semiconductor processes, as for example forming a sidewall spacer, and isotropically etching a cavity 108 into the carrier 102.

Forming a solid state electrolyte battery 106 over the inner surface 108a of the cavity 108 may include forming a battery 106 as already described referring to FIG. 1, FIG. 2A and FIG. 2B, or as described in the following. Forming a battery 106 may include at least one process of the following processes: a layering process, a thermal treatment.

Forming a solid state electrolyte battery 106 may include forming a layer stack 110, wherein the layer stack 110 may include at least one layer of the following layers: a cathode layer, an anode layer, an electrolyte layer (e.g. including a solid state electrolyte), a cathode current collector layer, an anode current collector layer, and an insulating layer (e.g. electrically separating the layer stack 110 from the carrier 102 and/or from the electronic circuit 104.

The solid state electrolyte battery may be formed using a conformal deposition process, e.g. using at least one of a low pressure chemical vapor deposition process and an atomic layer deposition process. The solid state electrolyte battery may be formed by applying a plurality of conformal deposition processes, e.g. using a plurality of low pressure chemical vapor deposition processes and/or a plurality of atomic layer deposition processes.

Process 330 may include forming at least one of the following types of batteries: a solid state electrolyte battery (that means a solid state battery, wherein the electrodes are provided via solid state materials and the electrolyte is a solid state material as well), a lithium-ion based battery, a solid state lithium-ion based battery, a thin film battery, a lithium-ion based thin film battery, or any other type of suitable solid state electrolyte battery, e.g. a metal hydride based thin film battery including a solid state electrolyte layer. The battery 106 formed in process 330 may be a primary or a secondary battery; in other words, the solid state electrolyte battery 106 may be a rechargeable battery or a non-rechargeable battery.

Forming the layer stack 110 may include forming a lithium-ion based thin film battery, e.g. a rechargeable lithium-ion based thin film battery. The method for manufacturing an integrated circuit structure 100 may further include providing (or forming) a metallization structure (or a metallization layer) electrically connecting the solid state electrolyte battery 106 with at least part of the electronic circuit 104.

Using method 300, as described above, may allow manufacturing an integrated rechargeable battery (a rechargeable battery being integrated into an electronic circuit) via semiconductor technology. Method 300 may be integrated into any semiconductor technology. Since the process 330 of forming the battery 106 may be performed at the end of the manufacturing process 300, there may be little concerns on thermal stability of the used battery layer stack 110. The battery 106 as described herein may be an on-board battery, wherein integrating an on-board battery (or a plurality of on-board batteries) into the integrated circuit may allow reducing the device cost. In general, method 300 may combine techniques and materials as used in both, forming a rechargeable battery and forming a semiconductor structure, which may result in an easy and/or cost efficient manufacturing process.

Figure 6:
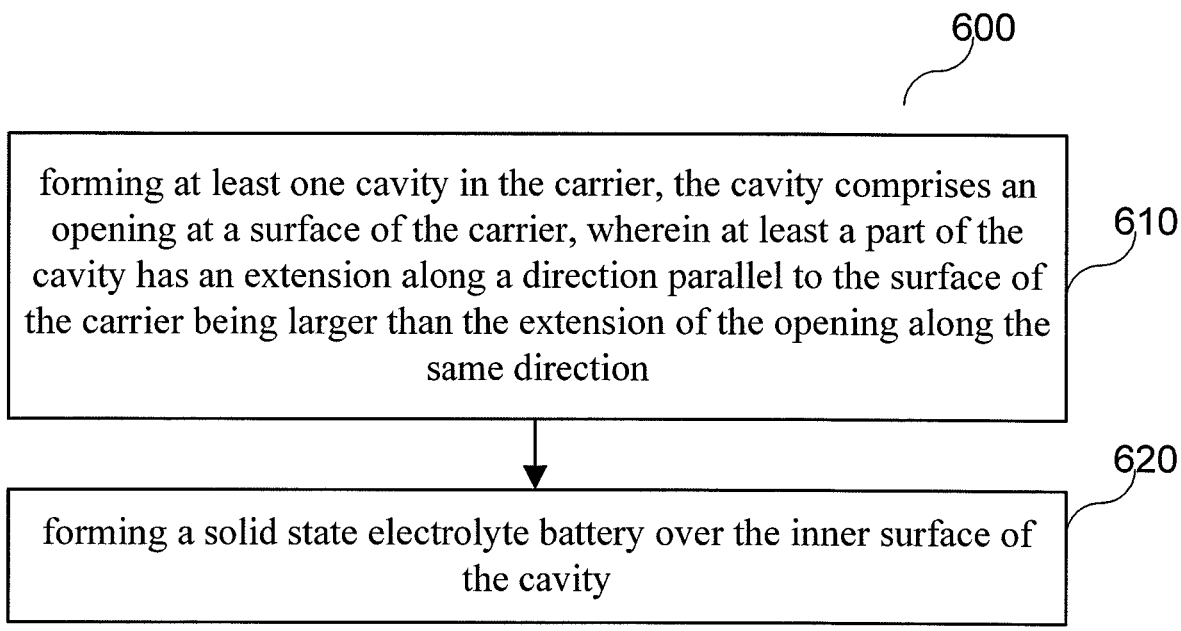
FIG. 6 shows a flow diagram of a method for manufacturing a battery structure, according to various embodiments.
Figure 7A:
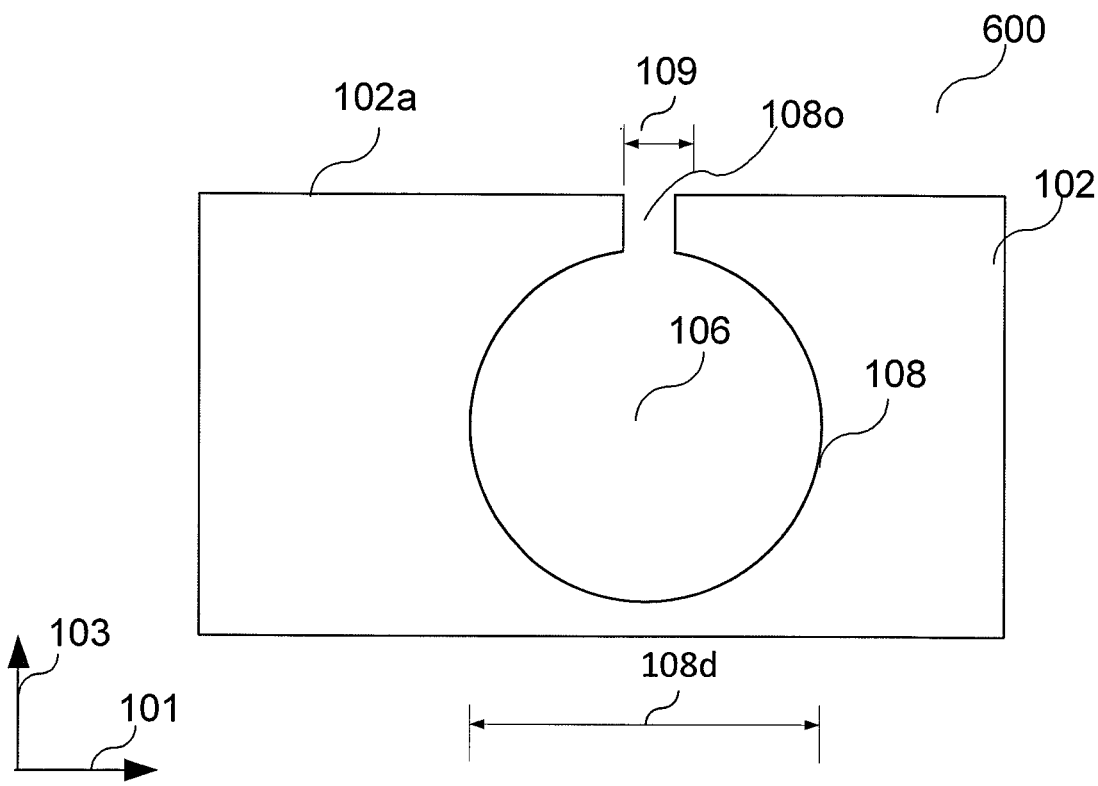
FIGS. 7A and 7B respectively show a schematic view of a battery structure, according to various embodiments.
Figure 7B:
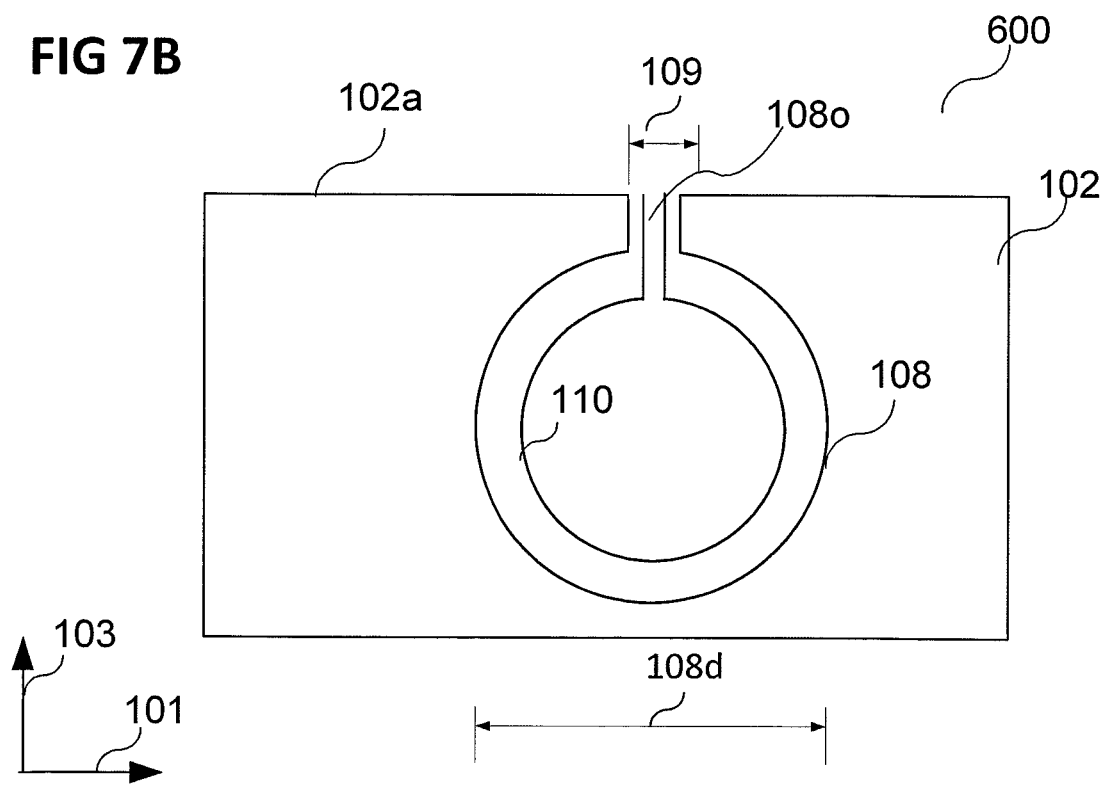

In analogy, a battery structure may be formed, including a cavity 108 formed into a carrier 102, wherein a battery 106 may be arranged at least partially within the cavity, wherein the cavity 108 may include at least one cavity opening 108o at the surface 102a of the carrier 102, wherein the lateral extension of the cavity may be larger than the lateral extension of the opening 108a of the cavity 108. Therefore, a battery 106 may be arranged in a carrier 102, wherein at least a surface region of the surface 102a of the carrier 102 over the battery 106 may be free for another purpose, e.g. for forming an electronic circuit 104 (as illustrated in FIG. 6, FIG. 7A and FIG. 7B).

FIG. 4A to FIG. 4M respectively illustrate a schematic view of an integrated circuit structure 100 during manufacture, according to various embodiments. The method 300 of forming an integrated circuit structure 100 may include processing a carrier 102, as described in the following.

Further, the integrated circuit structure 100 may be configured, as described in the following.

Figure 4A:
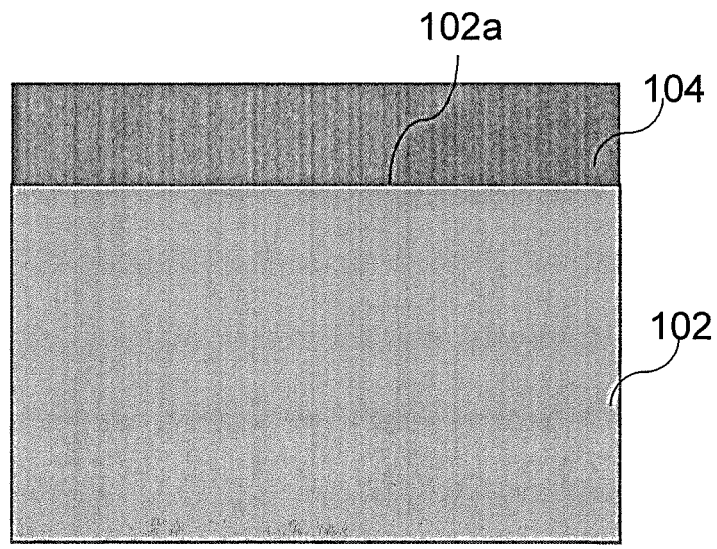
FIGS. 4A to 4M show respectively a schematic view of an integrated circuit structure during manufacture, according to various embodiments.

FIG. 4A illustrates a carrier 102 including an electronic circuit 104, e.g. after process 310 of method 300 has been carried out, according to various embodiments. The carrier 102 may include the materials and may be configured, as described before. The carrier 102 may be a silicon wafer. The electronic circuit 104 may include a readily processed electronic circuit or integrated circuit in any technology, e.g. a CMOS integrated circuit, a bipolar transistor, an IGBT, and/or a micro-electro-mechanical system, or any other component or structure as already described.

The electronic circuit 104 may be formed over the whole surface 102a of the carrier 102 or at least over a part of the surface 102a of the carrier 102. Forming the electronic circuit 104 may include a semiconductor process performed in a temperature range, which may damage a layer stack 110, e.g. formed in process 330 of method 300, therefore, process 310 of forming (or providing) the electronic circuit 104 may be performed before process 330 of forming a battery 106 is carried out. Thus, forming an electronic circuit 104 may be not limited by a degradation temperature of the battery 106.

Figure 4B:
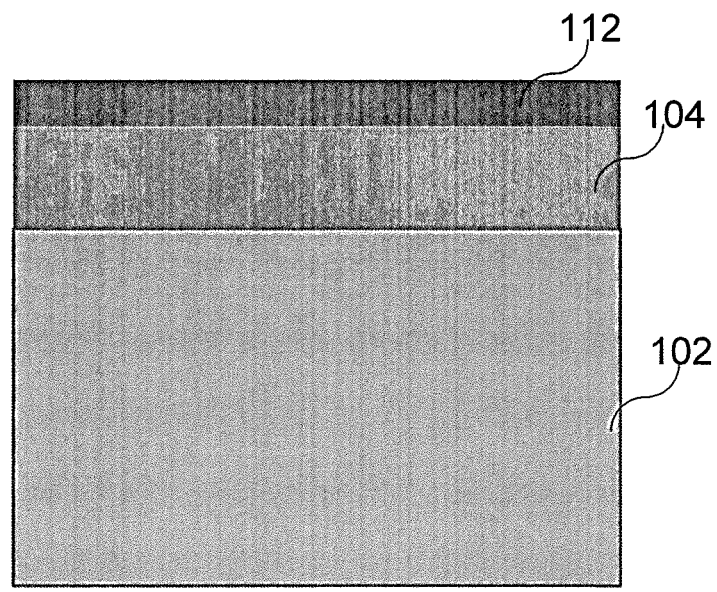

As illustrated in FIG. 4B, the electronic circuit 104 may be covered with a masking material 112 or with a mask layer 112. The mask layer 112 may include a hard mask material. The mask layer may include at least one of the following masking materials: an oxide, e.g. silicon oxide, polysilicon, carbon, a nitride, silicon nitride, silicon oxynitride, and the like. The mask layer 112 may include a soft mask material, e.g. a resist.

Figure 4C:
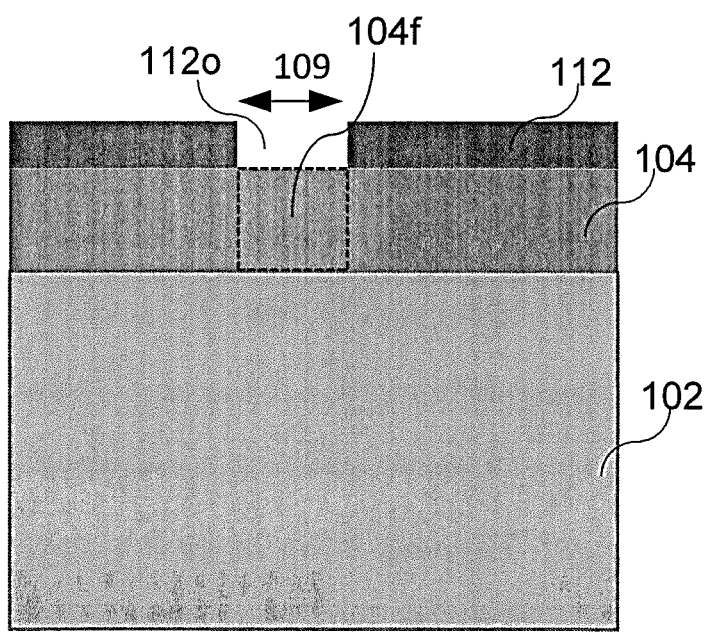

As illustrated in FIG. 4C, the mask layer may be patterned (opened), such that at least one region 104f of the electronic circuit 104 may be exposed. The patterned mask layer 112, as shown in FIG. 4C, may include a patterned resist layer 112 and/or a patterned hard mask layer 112. The patterned mask layer 112 may have at least one opening 112o exposing a part 104f of the electronic circuit 104. The width 109 (the lateral extension, or the extension along a direction parallel to the surface 102a of the carrier 102) of the opening 112o, and therefore, the width 109 of the exposed region 104f of the electronic circuit 104 may be adapted according to the thickness of a layer stack (battery layer stack) to be formed in a subsequent process (cf. FIG. 4J). The width 109 of the opening 112o may be in the range from about several hundreds of nanometers to about several micrometers, e.g. the width 109 of the opening 112o may be in the range from about 100 nm to about 5 µm, e.g. in the range from about 500 nm to about 2 µm, or larger than 5 µm.

The region 104f being exposed may a reserved region, which may be designed to be removed for providing the battery 106 in the carrier 102. The region 104f may be a dummy region or may include dummy structures, e.g. the region 104f may be a non-active region of the electronic circuit 104. The region 104f being exposed may have a small footprint (102f), such that the surface area of the carrier 102 being available for the electronic circuit 104 may be as large as possible.

Figure 4D:
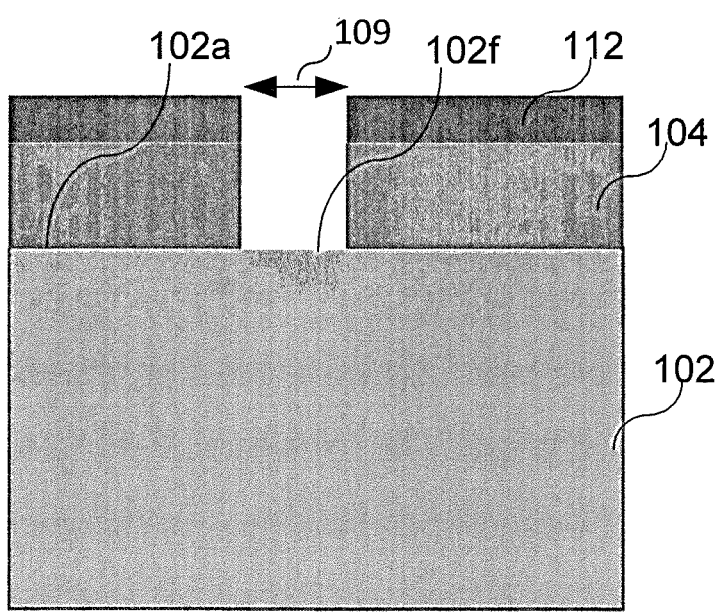

According to various embodiments, as illustrated in FIG. 4D, the surface 102a of the carrier 102 may be partially exposed, e.g. the region 104f of the electronic circuit 104 may be removed (using an etch process) exposing a part 102f of the surface 102a of the carrier 102. The area of the exposed surface 102f of the carrier 102 may be defined by the opening 112o of the patterned mask layer 112 and the etch process being used to remove the part 104f of the electronic circuit 104.

The processed carrier 102 shown in FIGS. 4A to 4D may be formed by applying process 310 of method 300; in other words, the method 300 may include, in process 310, processing a carrier 102 as described referring to FIGS. 4A to 4D. Alternatively, providing a carrier 102 may include forming (providing) a patterned electronic circuit 104, e.g. an electronic circuit 104 arranged on a carrier 102, wherein at least one surface region 102f of the carrier 102 may be exposed (e.g. the at least one surface region 102f of the carrier 102 may be free of structures of the electronic circuit 104).

Figure 4E:
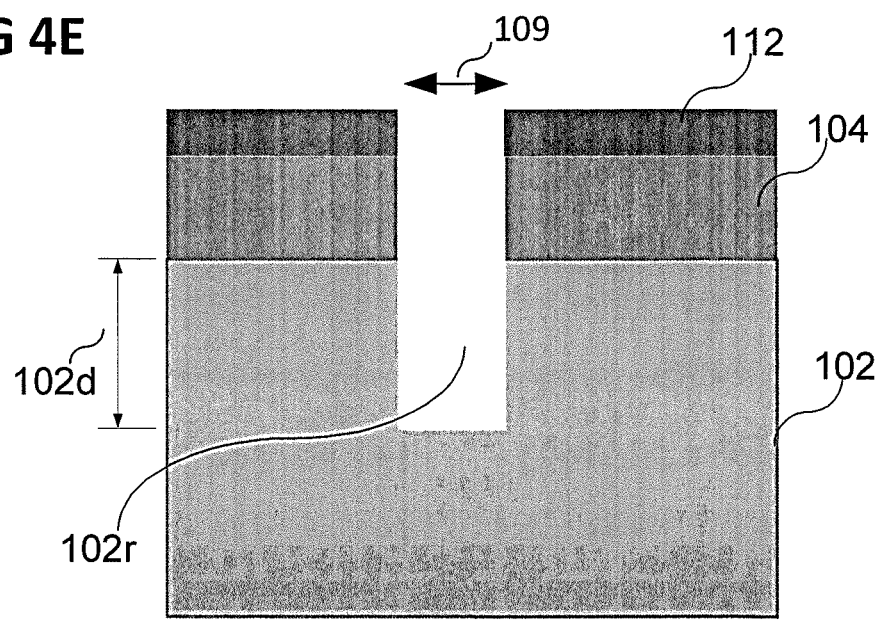

As illustrated in FIG. 4E, a recess 102r may be formed in the carrier 102, extending from the exposed region 102f of the surface of the carrier 102 into the carrier. The recess 102r may be formed by using the patterned mask layer 112 combined with an anisotropic etch process, e.g. plasma etching or reactive ion etching.

The depth 102d of the recess 102r (or the trench) may depend on the desired size and/or shape of the cavity 108, which shall be formed in a subsequently performed process (cf. FIG. 4H). In other words, the size of the cavity 108 may be defined and/or may be limited by the depth 102d of the recess 102r. The depth 102d of the recess 102r (the spatial extension of the recess 102r along a direction 103 perpendicular to the surface 102a of the carrier 102) may be in the range from about several hundreds of nanometers up to several hundreds of micrometers, e.g. in the range from about 100 nm to about 100 µm, or even larger than 100 µm. The depth 102d of the recess 102r may be smaller than half of the thickness of the carrier 102 (the spatial extension of the carrier 102 along a direction 103 perpendicular to the surface 102a of the carrier 102).

Figure 4F:
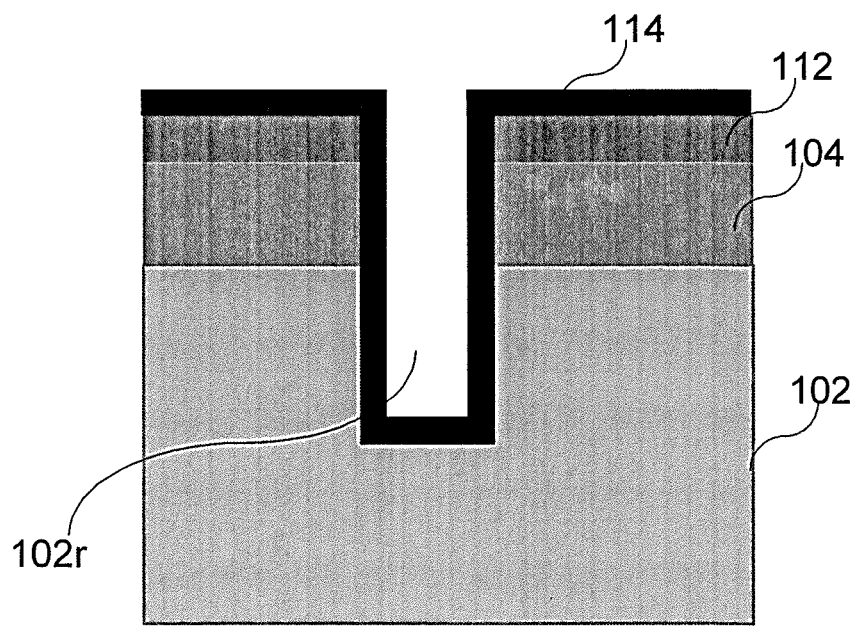
Figure 4G:
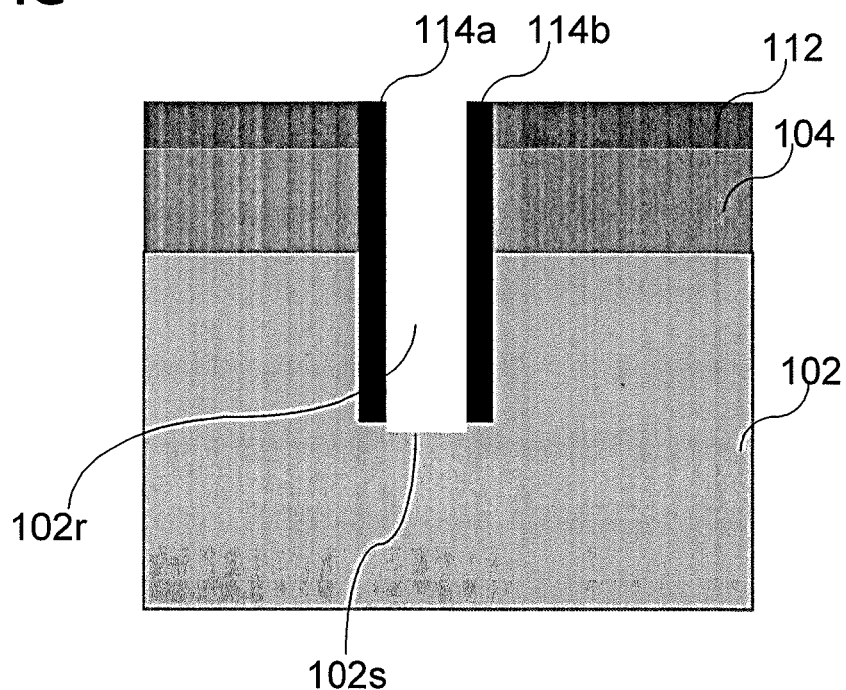

As illustrated in FIG. 4F and FIG. 4G, an assisting spacer structure 114a, 114b may be formed. Therefore, a spacer material layer 114 may be deposited or formed over the surface of the processed carrier 102. The spacer material layer 114 may be deposited using a conformal deposition process, such that at least the sidewalls of the recess 102r in the carrier 102 and/or the exposed sidewalls of the electronic circuit 104 may be covered with the spacer material layer 114, as shown in FIG. 4F. The spacer material layer 114 may include at least one material of the following group of material, the group including: an oxide, e.g. silicon oxide, a metal oxide, polysilicon, carbon, a nitride, silicon nitride, a metal nitride, silicon oxynitride, and the like.

Subsequently, as shown in FIG. 4G, the assisting spacer structure 114a, 114b may be formed by applying for example an anisotropic etch process (e.g. plasma etching, e.g. reactive ion etching) on the deposited spacer material layer 114. The assisting spacer structure 114a, 114b covering at least the sidewalls of the recess 102r formed within the carrier 102 and/or the exposed sidewalls of the electronic circuit 104. Forming an assisting spacer structure 114a, 114b from the spacer material layer 114 (shown in FIG. 4F) may include exposing the bottom surface 102s of the recess 102r formed in the carrier 102. The assisting spacer structure 114a, 114b may serve as etch barrier or as a masking structure, such that a cavity 108 may be formed in the carrier 102 in a subsequently performed additional etch process (cf. FIG. 4H).

Figure 4H:
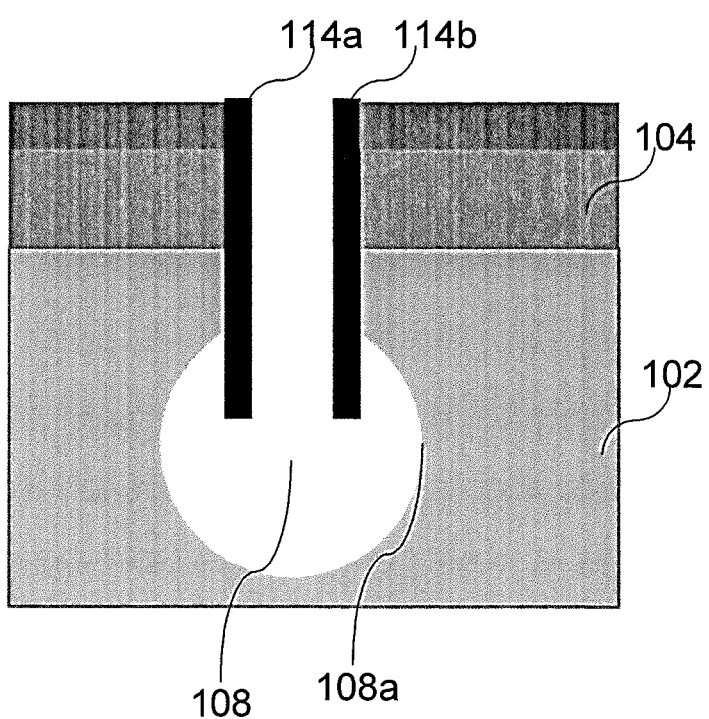
Figure 4I:
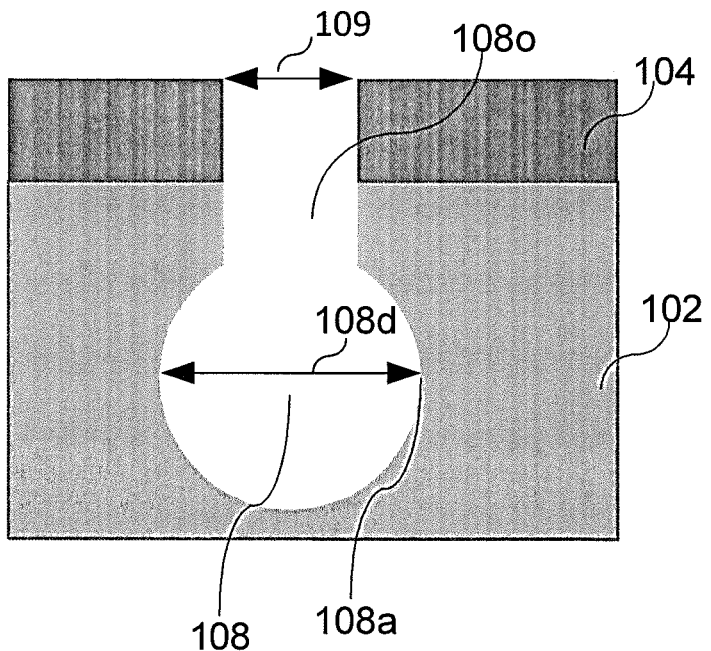

According to various embodiments, as illustrated in FIG. 4H and FIG. 4I, a cavity 108 may be formed in the carrier 102, the cavity 108 having an inner surface 108a and a cavity opening 108o at the surface 102a of the carrier 102. The cavity 108 may be formed by applying an isotropic etch process, e.g. an isotropic wet etch process or an isotropic dry etch process, resulting in a cavity 108 within the carrier 102, as shown in FIG. 4H. The etch process forming the cavity 108 may be carried out, such that the lateral extension 108d of the cavity 108 may be larger than the lateral extension of the recess 102r (e.g. having the width 109). The patterned mask material layer 112 may be removed during or after etching the cavity 108.

As shown in FIG. 4I, the assisting spacer structure 114a, 114b may be removed (using an etch process) after the cavity 108 has been etched (formed).

The processed carrier 102 shown in the FIGS. 4E to 4I may be formed by applying process 320 of method 300, e.g. after process 310 has been carried out; in other words, the method 300 may include, in process 320, processing a carrier 102 as described referring to FIGS. 4E to 4I. The cavity 108 may be provided (or formed), such that the cavity may include a cavity opening 108o at the surface of the carrier, wherein at least a part of the cavity 108 has an extension 108d along a direction parallel to the surface 102a of the carrier 102 being larger than the extension 109 of the opening 108a along the same direction. The diameter 108d (or at least the lateral extension) of the cavity 108 may be in the range from about several hundreds of nanometers to about several hundreds of micrometers. The cavity 108 may be formed (etched) in the carrier 102 in such a way, that the area of the inner surface 108a of the cavity 108 may be as large as possible. Forming the cavity 108, as described herein, may include combining materials (e.g. masking materials and/or a spacer materials) and etch processes, wherein the respective materials and corresponding etch processes may be combined in such a way, that a cavity 108 may be formed in the carrier, as described herein, e.g. having a cavity opening 108o at the surface of the carrier 102 being surrounded by an electronic circuit 104. As already described, the cavity 108 may have any desired shape which may be realized using semiconductor patterning processes, wherein at least a part of the cavity 108 has an extension 108d along a direction parallel to the surface 102a of the carrier 102 being larger than the extension 109 of the opening 108a along the same direction.

Figure 4J:
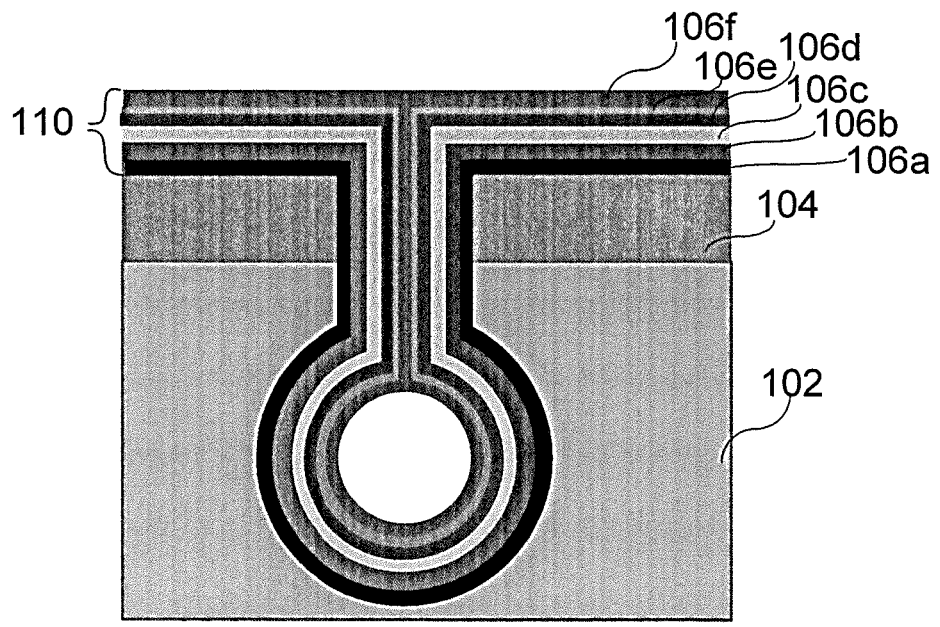

According to various embodiments, as illustrated in FIG. 4J, a battery 106 may be formed (or provided) being at least partially arranged within the cavity 108. The battery 106 may be or may include layer stack 110, wherein the layer stack 110 may be formed by applying a conformal deposition process (e.g. atomic layer deposition, e.g. LPCVD) for each layer of the layer stack, such that the layer stack may conformally cover the inner surface 108a of the cavity 108, and wherein for example a part of the layer stack 110 may be arranged outside of the cavity 108, as shown in FIG. 4J.

Forming the layer stack 110 at least partially within the cavity 108 in the carrier 102 may increase the capacity of the battery 106, without increasing the surface area being covered with the layer stack 110. The capacity of the battery 106 may increase with an increasing diameter 108d of the cavity 108, independently from the part of the battery 106 being arrange outside the cavity 108. Conformally depositing the layer stack 110 over the inner surface of cavity 108 may provide a larger capacity for the battery 106 as depositing the layer stack 110 on the inner surface of a commonly processed recess or trench, since at least a part of the cavity 108 has an extension 108d along a direction parallel to the surface 102a of the carrier 102 being larger than the extension 109 of the opening 108a along the same direction. In other words, the inner surface 108a of the cavity 108 may be larger than an inner surface of a commonly processed recess or trench having the same depth as the cavity 108 and the same opening area at the surface of the carrier 102 as the cavity 108. The cavity 108 may have substantially a spherical shape, providing a large surface area according to a specific volume.

Forming the layer stack 110 may include conformally depositing a dielectric layer 106a at least over the inner surface 108a of the cavity 108, e.g. conformally coating the cavity 108 and the electronic circuit 104 (as shown in FIG. 4I) after processes 310 and 320 of method 300 have been carried out. Further, forming the layer stack 110 may include conformally depositing a first current collector layer 106b over the dielectric layer 106a. Further, forming the layer stack 110 may include conformally depositing a first electrode layer 106c over the first current collector layer 106b. Further, forming the layer stack 110 may include conformally depositing an electrolyte layer 106d over the first electrode layer 106c; the electrolyte layer 106d may include a solid state electrolyte. Further, forming the layer stack 110 may include conformally depositing a second electrode layer 106e over the electrolyte layer 106d. Further, forming the layer stack 110 may include conformally depositing a second current collector layer 106f over the second electrode layer 106e.

According to various embodiments, the first current collector layer 106b, the first electrode layer 106c, the electrolyte layer 106d, the second electrode layer 106e, and the second current collector layer 106f may be the functional battery layers forming a battery 106. The first current collector layer 106b, the first electrode layer 106c, the electrolyte layer 106d, the second electrode layer 106e, and the second current collector layer 106f may be a battery layer stack.

The first current collector layer 106b may be additionally configured as diffusion barrier layer, preventing or reducing the diffusion of material from the layer stack into the carrier 102 and/or into the electronic circuit 104; the first current collector layer 106b may include or example titanium nitride as electrically conductive barrier material. An additional barrier layer, e.g. including titanium nitride, may be formed or may be disposed between the dielectric layer 106a and the first current collector layer 106b.

According to various embodiments, at least a part of the first current collector layer 106b and the second current collector layer 106f may be arranged outside the cavity 108 and/or the first current collector layer 106b and the second current collector layer 106f may be electrically connected (e.g. via a metallization structure), such that an access to the battery 106 (or the layer stack 110) may be provided, e.g. for charging the battery 106 and/or for operating the electronic circuit 104 via the battery 106.

The cavity opening 108o of the cavity 108 may be sealed by the layer stack, as shown in FIG. 4J. According to various embodiments, the thickness of the layers included in the layer stack may be adapted (cf. FIG. 5A and FIG. 5B) to provide the desired properties of the battery 106, e.g. a high capacity and/or a long lifetime.

Figure 4K:
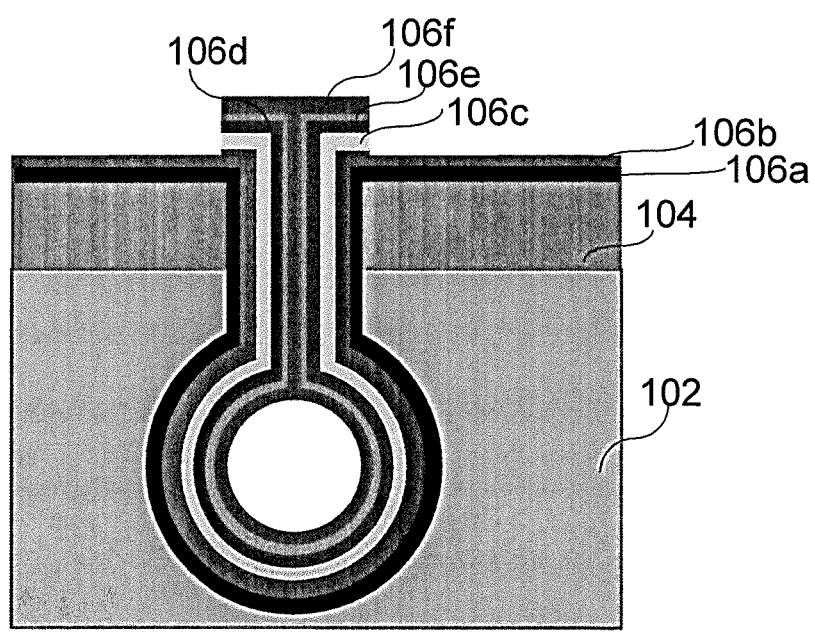
Figure 4L:
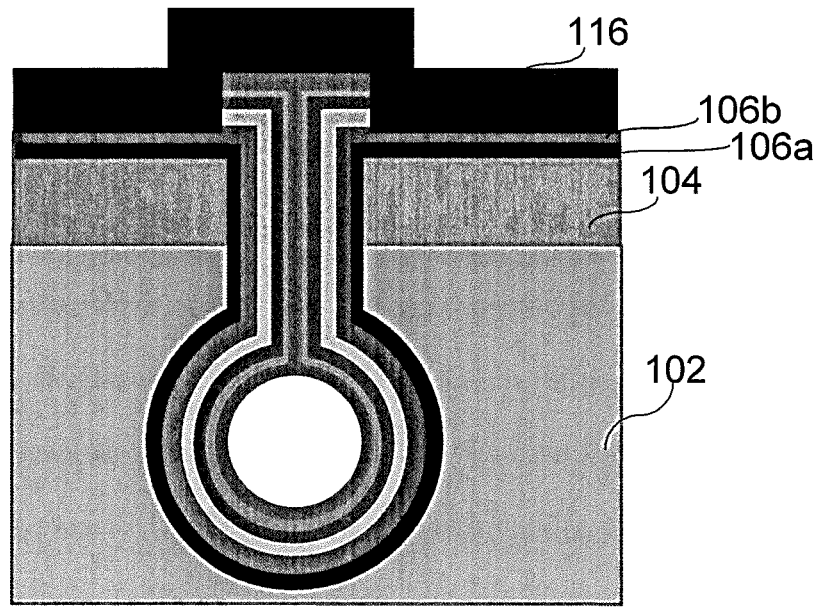
Figure 4M:
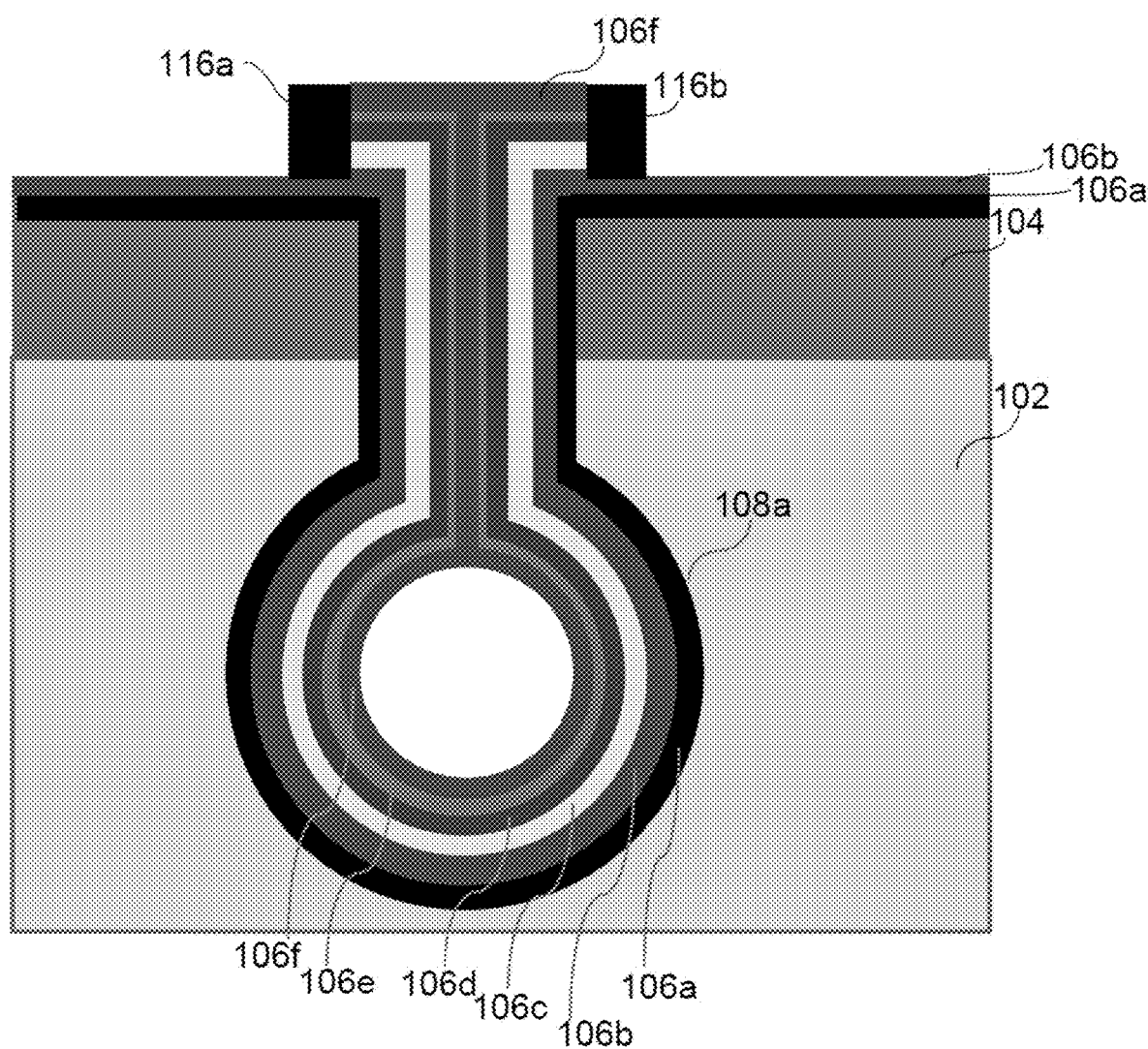

As illustrated in FIGS. 4K to 4M, a part of the layer stack 110 being arranged outside the cavity 108 may be patterned, e.g. using a lithographic process and an etch process (as for example shown in FIG. 4K), and thereby, the layer stack 110 may be adapted and/or sealed by forming a dielectric spacer structure 116a, 116b from a previously deposited dielectric spacer material layer 116, e.g. using a layering process and a subsequently performed etch process (as for example illustrated in FIG. 4L and FIG. 4M).

The dielectric spacer material layer 116 may include at least one of phosphosilicate glass (PSG), borosilicate glass (BSG), and phosphoborosilicate glass (PBSG). The dielectric spacer material layer 116 may include any other suitable electrically insulating material.

FIG. 4M illustrates an integrated circuit structure 100, including an electronic circuit 104 or an electronic circuit structure 104, a cavity 108 and a battery 106 formed within the cavity 108, wherein at least a part of the battery 106 being arranged within the cavity 108 may laterally overlap with the electronic circuit 104. This may allow an efficient use of the surface area of the carrier 102 for an electronic circuit 104, wherein a battery 106 having a sufficient high charge storage capacity may be provided at the same time.

Figure 5A:
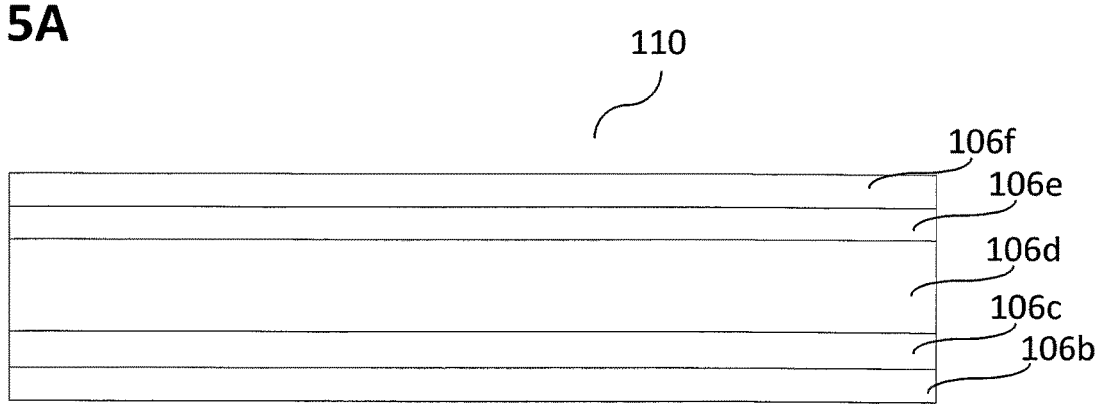
FIGS. 5A and 5B respectively show a cross section of a layer stack of a solid state electrolyte battery included in an integrated circuit structure, according to various embodiments.
Figure 5B:
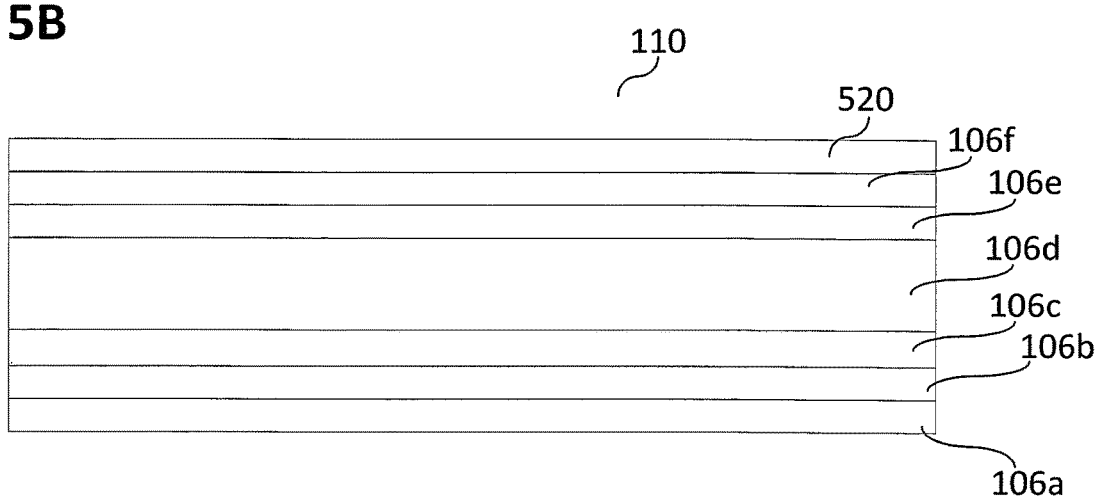

FIG. 5A and FIG. 5B show respectively a detailed view of the layer stack 110, already described herein. The layer stack 110 may include at least a first current collector layer 106b, a first electrode layer 106c, an electrolyte layer 106d, a second electrode layer 106e, and a second current collector layer 106f, to provide a battery 106.

The battery 106 may also include at least a first current collector region 106b, a first electrode region 106c, an electrolyte region 106d, a second electrode region 106e, and a second current collector region 106f, wherein the specific design of the regions may be adapted to the desired properties of the battery 106, e.g. a high capacity.

The first electrode layer 106c may be an anode layer or may function as an anode of the battery 106, and therefore, the first current collector layer 106b may be the anode current collector layer 106b. Referring to this, the second electrode layer 106e may be a cathode layer or may function as a cathode of the battery 106, and therefore, the second current collector layer 106f may be the cathode current collector layer 106b.

Alternatively, the first electrode layer 106c may a cathode layer or may function as a cathode of the battery 106, and therefore, the first current collector layer 106b may be the cathode current collector layer 106b. Referring to this, the second electrode layer 106e may be an anode layer or may function as an anode of the battery 106, and therefore, the second current collector layer 106f may be the anode current collector layer 106b.

A current collector layer or current collector region (e.g. the anode current collector layer and the cathode current collector layer) may include or may consist of at least one material of the following group of materials, the group including: an electrically conductive material, a metal, a metal nitride, a transition metal, a transition metal nitride, platinum, copper, aluminium, aluminum nano-rods, gold, titanium nitride, vanadium nitride, molybdenum nitride, tantalum nitride. At least one current collector layer may serve as diffusion barrier (e.g. at least one current collector layer may be titanium nitride diffusion barrier), wherein the current collector layer may prevent or at least reduce a diffusion of atoms, ions, or material (e.g. lithium and/or lithium-ions) from the solid state electrolyte battery 106 into the electronic circuit 104 or into the carrier 102. At least one current collector layer may serve as diffusion barrier (e.g. at least one current collector layer may be titanium nitride diffusion barrier), wherein the current collector layer may prevent or at least reduce a diffusion of atoms, ions, or material (e.g. lithium and/or lithium-ions) from the electronic circuit 104 or the carrier 102 into the solid state electrolyte battery 106.

The anode layer or the anode region may include or may consist of at least one material of the following group of materials, the group including: silicon, polysilicon, amorphous silicon, carbon, amorphous carbon, graphite, $Li_4Ti_5O_{12}$ (LTO), $CuN_3$, titanium oxide ($TiO_2$), or any other suitable anode material, as for example titanium, a metal silicide (e.g. calcium silicide, magnesium silicide, molybdenum silicide), $Li_{15}Si_4$, a lithium containing alloy (e.g. $Li_{22}Ms/M$ (M=Ge, Sn, Pb, Si)), $Li_{4.4}Si$, $Li_{4.4}Ge$, tin-oxide based glasses (e.g. $SnO-B_2O_3-P_2O_5-Al_2O_3$), $SnS-P_2S$, $Li_2S-P_2S_5$, silicon containing transition metal nitrides (e.g. $SiM_xN_y$ (M=Co, Ni, Cu)), Ni coated by $TiO_2$, Sn, Ge, Al, Pb, In, ZnO. The anode may be defined herein for example as the negative electrode during charge of the battery 106.

The cathode may include or may consist of at least one material of the following group of materials, the group including: lithium, cobalt, nickel, aluminium, oxygen, iron, phosphorous, sulfur, manganese, vanadium, manganese spinel, lithium nickel manganese cobalt, lithium iron phosphate (doped or undoped), transition metal oxides (e.g. $MnO_2$, $Fe_3O_4$, $Co_3O_4$, $TiO_2$, NiO), olivine (e.g. $LiCoPO_4$), $LiCoO_2$, $LiNiO_2$, $LiNi_xMn_yO_2$, $LiNi_{1-x}Co_xO_2$, $LiNi_{0.85}Co_{0.1}Al_{0.05}O_2$, $LiNi_{0.33}Co_{0.33}Mn_{0.33}O_2$, $LiMn_2O_4$ (spinel structure), $Li_{4/3}Ti_{5/3}O_4$, $V_2O_5$, amorphous $V_2O_5$, $LiMn_2O_4$, and $LiFePO_4$, or any other suitable cathode material, e.g. including nickel or stainless steel. The anode may be defined herein for example as the positive electrode during charge of the battery 106.

The electrolyte layer or electrolyte region (e.g. a solid state electrolyte layer or region) may include or may consist of at least one material of the following group of materials, the group including: lithium, phosphorus, lanthanum, titanium, lithium phosphorus oxynitride, lithium lanthanum titanium oxide (LLTO), a polymer, poly-oxyethylene, $LiPO_{1-x}N_{1-y}$, thio-LISICON materials (lithium superionic conductor, e.g. $Li_xGe_yP_zS_4$), $Li_xM_{1-y}M'_yS_4$ (M=Si or Ge, and M'=P, Al, Zn, Ga, or Sb), $Li_xAl_yTi_z(PO_4)$ or any other suitable electrolyte, e.g. sodium super ion conductors (NA-SICON), NASICON-type materials (e.g. $Na_{1+x+4y}M_{2-y}Si_xP_{3-x}O_{12}$, $0 \leq x \leq 3$, $0 \leq y \leq 1$ (M=Ti, Hf, or Zr)), $Li_2S-P_2S_5$, $Li_2S-P_2S_5-SiS_2$, $Li_2S-SiS_2$, or oxysulfide glass (e.g. $[[Li_2S]_{0.6}[SiS_2]_{0.4}]_{1-x}[Li_xMO_y]_x$ (M=Si, P, Ge, B, Al, Ga, In)). A solid state electrolyte may be regarded as a material which may transport electrical charge due to the movement of ions in the material, e.g. through channels, voids, or empty crystallographic positions in their crystal structure.

A current collector layer (e.g. the first current collector layer 106b and/or the second current collector layer 106f) may have a thickness in the range from about 5 nm to about 100 nm, e.g. in the range from about 10 nm to about 50 nm. According to various embodiments, the layer thickness of a current collector layer may depend on the specific electrical conductivity of the respective layer serving as current collector layer.

The anode layer may have a thickness for example in the range from about 5 nm to about 100 nm, e.g. larger than 100 nm, e.g. from about 10 nm to about 50 nm, e.g. smaller than 10 nm, e.g. larger than 50 nm.

According to various embodiments, the cathode layer may have a thickness for example in the range from about 5 nm to about 100 nm, e.g. larger than 100 nm, e.g. from about 10 nm to about 50 nm, e.g. smaller than 10 nm, e.g. larger than 50 nm.

The electrolyte layer may have a thickness for example in the range from about 5 nm to about 100 nm, e.g. larger than 100 nm, e.g. from about 10 nm to about 50 nm, e.g. smaller than 10 nm, e.g. larger than 50 nm.

The anode layer may have a thickness of about 30 nm, the cathode layer may have a thickness of about 30 nm, and the electrolyte layer may have a thickness of about 30 nm.

The thickness of the anode layer and the corresponding thickness of the cathode layer may be selected according to the charge storage properties of the respective material forming the anode layer and the corresponding cathode layer.

The thickness of the electrolyte layer 106d may be large enough, e.g. larger than 5 nm, to function as an electrolyte layer, e.g. to conduct lithium-ions, or e.g. being transparent for lithium-ions (wherein the electrolyte layer may not allow a distinct transport of electrons). The electrolyte layer 106d may be deposited using atomic layer deposition, e.g. atomic layer chemical vapor deposition, resulting in a smooth, closed, and dense layer.

After the layer stack 110 (or the battery 106) has been formed, an annealing process, e.g. a thermal treatment, may be carried out, e.g. to introduce recrystallization processes or other improvements, as for example mechanical stability.

The layer thickness of the anode layer in the battery 106 may be limited due to physical or chemical reasons, e.g. a silicon layer as an anode may degrade while storing lithium-ions, if the silicon layer may be too thick, e.g. thicker than 50 nm or thicker than 100 nm for example. The charge storage capacity of the battery 106 may increase with an increased volume of the charge storing anode layer, e.g. the volume of the material providing the anode. Due to covering the inner surface of the cavity 108, the surface area of the anode layer may change according to the shape and size of the cavity 108. Therefore, the charge storing capacity may be adapted (e.g. increased) while the layer thickness of the charge storing anode layer may have a desired thickness.

As shown in FIG. 5B, the layer stack may further include a first dielectric layer 106a, including an electrically insulating material, e.g. an electrically insulating oxide, e.g. silicon oxide. The first dielectric layer 106a may electrically separate the battery 106 from the carrier 102 and/or from the electronic circuit 104. The layer stack may further include a protection layer 520 on top of the second current collector layer 106f, e.g. to protect the battery 106.

FIG. 6 illustrates a flow diagram of a method 600 for manufacturing a battery structure, according to various embodiments; the method including: in 610, forming at least one cavity 108 in a carrier 102, the at least one cavity 108 may include a cavity opening 108o at a surface 102a of the carrier 102, wherein at least a part of the cavity 108 has an extension 108d along a direction parallel to the surface 102a of the carrier 102 being larger than the extension 109 of the opening 108a along the same direction; and, in 620, forming a solid state electrolyte battery 106 over the inner surface 108a of the cavity 108.

Process 610 of method 600 may be performed in a similar way as described herein for the process 320 of method 300. Process 620 of method 600 may be performed in a similar way as described herein for the process 330 of method 300.

Forming the solid state electrolyte battery 106 may include forming a layer stack 110, wherein the layer stack may include at least one cathode layer, at least one anode layer, and at least one electrolyte layer being arranged between the at least one cathode layer and the at least one anode layer. Forming the solid state electrolyte battery 106 may include forming a layer stack 110 including the functional layers 106b, 106c, 106d, 106e, 106f, as already described.

Forming the layer stack 110 may further include forming at least one cathode current collector layer adjoining the at least one cathode layer and forming at least one anode current collector layer adjoining the at least one anode layer.

According to various embodiments, forming the layer stack may include forming a lithium-ion based thin film battery.

FIG. 7A illustrates a battery structure 600; the battery structure 600 including: a cavity 108 being arranged in a carrier 102, wherein the cavity 108 may extend from the first surface 102a of the carrier 102 into the carrier 102. The cavity 108 may have at least one cavity opening 108o at the first surface 102a of the carrier 102. As shown in FIG. 7A, the diameter 108d of the cavity 108 (e.g. an extension 108d of the cavity 108 along a direction 101 parallel to the surface 102a of the carrier 102) may be larger than the diameter 109 of the cavity opening 108o of the cavity 108 at the surface 102a of the carrier 102 (e.g. an extension of the cavity opening 108o of the cavity 108 along a direction 101 parallel to the surface 102a of the carrier 102). A battery 106 may be at least partially arranged within the cavity 108.

As illustrated in FIG. 7B, a layer stack 110 may be formed over the inner surface 108a of the cavity 108, wherein the layer stack 110 may include the functional layers providing the battery 106. In other words, the inner surface 108a of the cavity 108 may be covered (or coated) with a plurality of material layers providing the functional layers of the thin film solid state electrolyte battery 106. The battery structure 600, as described herein, may include a plurality of cavities 108 being arranged in the carrier 102, wherein a battery 106 may be included in each cavity 108 of the plurality of cavities 108. The battery 106 formed within the cavity 108 may include the layer stack 110, as described referring to FIG. 5A and FIG. 5B.

The layer stack 110 included in the battery structure 600 may be conformally disposed over the inner surface 108a of the cavity 108. Each layer included in the layer stack 110 may be conformally disposed over the inner surface 108a of the cavity 108. Illustratively, the layer stack 110 may have a similar shape as the inner surface 108a of the cavity 108, since each layer of the layer stack 110 may be for example formed using a conformal deposition process, e.g. ALD or ALCVD.

According to various embodiments, the cavity 108 formed in the carrier 102 may have another shape, as shown in the figures. The shape of the cavity 108 may include at least one shape of the following group of shapes: a cylindrical shape, a spherical shape, a prismatic same, cubic shape, a conoid shape, or any other suitable shape, e.g. the shape of a rotational solid. The shape of the cavity 108 may be adapted to provide a large area of the inner surface 108a while having a small opening 108a at the surface 102a of the carrier 102. Therefore, the cavity 108 may also have an asymmetric shape. Further, the cavity 108 may include a plurality of cavities being connected with each other, and therefore, providing a connected inner surface 108a. The layer stack 110 may be conformally disposed over a connected inner surface 108a (or inner sidewall 108a) of a plurality of cavities 108 being arranged in the carrier 102 having at least one opening 108a at the surface 102a of the carrier 102. The layer stack 110 may be conformally deposited through the at least one opening 108a at the surface 102a of the carrier 102.

The carrier 102 included in the battery structure 600 may be a silicon wafer, or any other type of carrier, as described before.

The battery structure 600, as described herein, may include a cavity 108 and a battery 106 similar to the integrated circuit structure 100, as already described. The battery structure 600, as described herein, may provide a carrier 102 including a battery 106, wherein the provided area for the layer stack 110 forming the battery 106 may be larger than the consumed surface area 102f of the carrier 102.

Providing an electronic circuit 104 or providing an electronic structure 104 may include at least one front-end-of-line (FEOL) process. Forming the battery 106 may be performed after the electronic circuit 104 or the electronic structure 104 may be completed, e.g. the FEOL processing may be finished, apart from of the metallization structure.

According to various embodiments, the integrated circuit structure 100, as illustrated herein, may be finally covered with a protection layer, to protect the subjacent battery 106 and/or the electronic circuit 104.

According to various embodiments, a cavity as described herein may be a hollow chamber, a void or an empty space being at least partially surrounded by a material, e.g. by the carrier material. The exposed surface of the material surrounding (or forming) the hollow chamber facing inside the hollow chamber may be referred to as inner surface 108a of the cavity 108.

An integrated circuit structure 100 may include: an electronic circuit 104 being arranged on a surface 102a of a carrier 102; a solid state electrolyte battery 106 being at least partially arranged within the carrier 106, wherein at least a part of the solid state electrolyte battery 106 being arranged within the carrier 102 is overlapping with the electronic circuit 104 along a direction parallel to the surface 102a of the carrier 102. An integrated circuit structure 100 may include: an electronic circuit 104 being arranged on a surface 102a of a carrier 102; a solid state electrolyte battery 106 being at least partially arranged within the carrier 106, wherein at least a part of the solid state electrolyte battery 106 being arranged within the carrier 102 is disposed below the electronic circuit 104.

According to various embodiments, the solid state electrolyte battery may be formed within a cavity 108 provided in the carrier 102.

The cavity may include at least one cavity opening 108o at the surface 102a of the carrier 102, wherein the cavity 108 may be overlapping with the electronic circuit 104 along a direction parallel to the surface 102a of the carrier 102. The cavity may include at least one cavity opening 108o at the surface 102a of the carrier 102, wherein the cavity 108 may extend in a region below the electronic circuit 104.

The solid state electrolyte battery 106 may be electrically coupled with at least part of the electronic circuit 104. The solid state electrolyte battery 106 may be configured to provide electrical energy to the electronic circuit 104. The solid state electrolyte battery 106 may be configured to store electrical energy generated from the electronic circuit 104.

According to various embodiments, the solid state electrolyte battery 104 may include a layer stack 110 including at least one cathode layer, at least one anode layer, and at least one electrolyte layer being arranged between the at least one cathode layer and the at least one anode layer. The layer stack may be a battery layer stack providing the battery 106.

According to various embodiments, the layer stack may further include an anode current collector layer adjoining the at least one anode layer and a cathode current collector layer adjoining the at least one cathode layer.

According to various embodiments, the integrated circuit structure may further include an electrically insulating layer 106a disposed between at least the carrier 102 and the solid state electrolyte battery 106.

According to various embodiments, the layer stack 110 may be conformally disposed over the inner surface 108a of the cavity 108.

A battery structure 600 may include: at least one cavity 108 arranged within a carrier 102, the cavity 108 including a cavity opening 108o at a surface 102a of the carrier 102, wherein at least a part of the cavity 108 has an extension 108d along a direction parallel to the surface 102a of the carrier 102 being larger than the extension 109 of the cavity opening 108a along the same direction, and a solid state electrolyte battery 106 being at least partially arranged within the cavity 108.

According to various embodiments, the solid state electrolyte battery 106 may include a layer stack 110 including at least one cathode layer, at least one anode layer, and at least one electrolyte layer being arranged between the at least one cathode layer and the at least one anode layer.

According to various embodiments, the layer stack 110 may further include an anode current collector layer adjoining the at least one anode layer and a cathode current collector layer adjoining the at least one cathode layer.

According to various embodiments, the solid state electrolyte battery 106 may include a layer stack 110 including at least one cathode layer, at least one anode layer, at least one electrolyte layer being arranged between the at least one cathode layer and the at least one anode layer, and at least one anode current collector layer adjoining the at least one anode layer and at least one cathode current collector layer adjoining the at least one cathode layer, wherein each layer of the layer stack 110 may have a thickness in the range from about 5 nm to about 10 µm, e.g. in the range from about 5 nm to about 5 µm, e.g. in the range from about 5 nm to about 1 µm. Thereby, the layer thicknesses of the layers included in the layer stack 110 may depend on requirements like energy density and/or power density.

According to various embodiments, the layer stack 110 may further include at least one dielectric layer 106a arranged between the carrier and the solid state electrolyte battery.

According to various embodiments, the layer stack 110 may be conformally disposed over the inner surface 108a of the cavity 108.

A method 300 for manufacturing an integrated circuit structure 100 may include: providing an electronic circuit 104 on a surface 102a of a carrier 102; (e.g. subsequently) forming at least one cavity 108 in the carrier 102, the cavity 108 may include a cavity opening 108o at the surface 102a of the carrier 102, wherein at least a part of the cavity 108 has an extension 108d along a direction parallel to the surface 102a of the carrier 102 being larger than the extension 109 of the opening along the same direction; and forming a solid state electrolyte battery 106 over the inner surface 108a of the cavity 108.

Providing an electronic circuit 104 may include providing (or forming) at least one electronic component 104 of the following group of electronic components, the group including: an integrated circuit, a sensor structure, a micromechanical device, an electro optical structure, a transistor, an inductor, a capacitor, a transmitter, and a transceiver.

The method 300 for manufacturing an integrated circuit structure 100 may further include forming an electrically insulating layer 106a over at least the inner surface 108a of the cavity 108 before the solid state electrolyte battery 106 is formed. The electrically insulating layer 106a may be a part of the layer stack 110.

Forming the solid state electrolyte battery 106 may include forming a layer stack 110, wherein the layer stack may include at least one cathode layer, at least one anode layer, and at least one electrolyte layer being arranged between the at least one cathode layer and the at least one anode layer.

Forming the layer stack may further include forming at least one cathode current collector layer adjoining the at least one cathode layer and forming at least one anode current collector layer adjoining the at least one anode layer.

According to various embodiments, the solid state electrolyte battery may be formed using a conformal deposition process. According to various embodiments, the solid state electrolyte battery may be formed using a plurality of conformal deposition processes.

Forming the layer stack may include forming a lithium-ion based thin film battery.

According to various embodiments, the method 300 for manufacturing an integrated circuit structure 100 may further include providing a metallization structure electrically connecting the solid state electrolyte battery 106 with at least part of the electronic circuit 104.

According to various embodiments, a method for manufacturing a battery structure may include: forming at least one cavity in the carrier, the cavity may include an opening at a surface of the carrier, wherein at least a part of the cavity has an extension along a direction parallel to the surface of the carrier being larger than the extension of the opening along the same direction; and forming a solid state electrolyte battery over the inner surface of the cavity.

According to various embodiments, forming the solid state electrolyte battery 106 may include forming a layer stack 110, wherein the layer stack 110 may include at least one cathode layer, at least one anode layer, and at least one electrolyte layer being arranged between the at least one cathode layer and the at least one anode layer.

Forming the layer stack 110 may further include forming at least one cathode current collector layer adjoining the at least one cathode layer and forming at least one anode current collector layer adjoining the at least one anode layer.

Forming the layer stack 110 may include forming a lithium-ion based thin film battery.

Forming the battery 106 may include forming a lithium-ion based thin film battery, e.g. by forming the appropriate cathode layer, anode layer, and electrolyte layer. The battery 106 may be configured as a lithium-ion based thin film battery, e.g. by selecting an appropriate cathode layer, anode layer, and electrolyte layer.

According to various embodiments, an integrated circuit structure 100 may include: an electronic circuit 104 being arranged on a surface 102a of a carrier 102; a solid state electrolyte battery 106 being at least partially arranged within the carrier 102, wherein at least a part of the solid state electrolyte battery being arranged within the carrier 102 is laterally overlapping with the electronic circuit 104.

According to various embodiments, an integrated circuit structure 100 may include: an electronic circuit 104 being arranged on a surface 102a of a carrier 102; a solid state electrolyte battery 106 being at least partially arranged within the carrier 102, wherein at least a first part of the solid state electrolyte battery is laterally overlapping with the electronic circuit 104, wherein the first part is being arranged within the carrier 102.

The solid state electrolyte battery may be formed within a cavity 108 provided in the carrier 102.

According to various embodiments, the cavity 108 may include at least one cavity opening 108o at the surface 102a of the carrier 102, wherein the cavity 108 may be laterally overlapping with the electronic circuit 104.

According to various embodiments, the solid state electrolyte battery 106 may be electrically coupled with at least part of the electronic circuit 104.

The integrated circuit structure may further include: an electrically insulating layer disposed between at least the carrier and the solid state electrolyte battery.

The integrated circuit structure may include a battery and at least one of one or more integrated circuits, one or more memory chips, one or more sensors, and the like.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit structure, comprising:
   an electronic circuit being arranged on a surface of a carrier; and
   a cavity and a cavity opening arranged within a carrier, wherein the cavity opening extends from the cavity to the surface of the carrier; and
   a solid state electrolyte battery being at least partially arranged within the cavity and the cavity opening of the carrier,
   wherein the solid state electrolyte battery is conformally disposed over an inner surface of the cavity and an inner surface of the cavity opening so that the solid state electrolyte battery encloses an empty portion of the cavity,
   wherein at least a part of the solid state electrolyte battery arranged within the carrier overlaps with the electronic circuit along a direction parallel to the surface of the carrier.

2. The integrated circuit structure of claim 1,
   wherein the cavity overlaps with the electronic circuit along a direction parallel to the surface of the carrier.

3. The integrated circuit structure of claim 1,
   wherein the solid state electrolyte battery is electrically coupled with at least part of the electronic circuit.

4. The integrated circuit structure of claim 1,
   wherein the solid state electrolyte battery comprises a layer stack comprising at least one cathode layer, at least one anode layer, and at least one electrolyte layer being arranged between the at least one cathode layer and the at least one anode layer.

5. The integrated circuit structure of claim 4,
   wherein the layer stack further comprises an anode current collector layer adjoining the at least one anode layer and a cathode current collector layer adjoining the at least one cathode layer.

6. The integrated circuit structure of claim 1, further comprising:
   an electrically insulating layer disposed between at least the carrier and the solid state electrolyte battery.

7. The integrated circuit structure of claim 4,
   wherein the layer stack is conformally disposed over an inner surface of the cavity and the cavity opening so as to at least extend from the cavity to the surface of the carrier.

8. An integrated circuit structure, comprising:
   an electronic circuit being arranged on a surface of a carrier; and
   a solid state electrolyte battery being at least partially arranged within the carrier,
   wherein the carrier comprises a substantially spherical cavity and wherein the solid state electrolyte battery is conformally disposed over an inner surface of the substantially spherical cavity so that the solid state electrolyte battery encloses an empty portion of the cavity;

wherein at least a part of the solid state electrolyte battery is laterally overlapping with the electronic circuit.

9. The integrated circuit structure of claim 8, wherein the cavity comprises at least one cavity opening at the surface of the carrier, wherein the cavity is laterally overlapping with the electronic circuit.

10. The integrated circuit structure of claim 8, wherein the solid state electrolyte battery is electrically coupled with at least part of the electronic circuit.

11. The integrated circuit structure of claim 8, wherein the solid state electrolyte battery comprises a layer stack comprising at least one cathode layer, at least one anode layer, and at least one electrolyte layer being arranged between the at least one cathode layer and the at least one anode layer.

12. The integrated circuit structure of claim 11, wherein the layer stack further comprises an anode current collector layer adjoining the at least one anode layer and a cathode current collector layer adjoining the at least one cathode layer.

13. The integrated circuit structure of claim 8, further comprising:

an electrically insulating layer disposed between at least the carrier and the solid state electrolyte battery.

14. The integrated circuit structure of claim 1, the electronic circuit comprising a semiconductor structure, wherein the semiconductor is one of the following: a MOS-structure, an nMOS-structure, a pMOS-structure, a CMOS-structure.

15. The integrated circuit structure of claim 1, the electronic circuit is one of the following: a chip, a memory chip, a die, a microprocessor, a microcontroller, a memory structure, a charge storage memory, a random access memory, a dynamic random access memory, a logic circuit, a sensor, a nanosensor, an integrated transceiver, a micro-mechanical device, a micro-electronic device, a nano-electronic device, a digital circuit, a radio-frequency identification (RFID) chip and a chip card module.

16. The integrated circuit structure of claim 1, the electronic circuit comprising a memory structure, wherein the memory structure includes at least one of the following: a volatile memory, a DRAM, a PROM, an EPROM, an EEPROM, a flash memory, a floating gate memory, a charge trapping memory, an MRAM, a CBRAM, and a PCRAM.

17. The integrated circuit structure of claim 1, the electronic circuit comprising an electronic component, wherein the electronic component includes at least one of the following: a transistor, a fin field effect transistor (FinFET), a power transistor, a bipolar transistor, an insulated gate bipolar transistor (IGBT)), a test structure.

18. The integrated circuit structure of claim 8, the electronic circuit comprising a semiconductor structure, wherein the semiconductor is one of the following: a MOS-structure, an nMOS-structure, a pMOS-structure, a CMOS-structure.

19. The integrated circuit structure of claim 8, the electronic circuit is one of the following: a chip, a memory chip, a die, a microprocessor, a microcontroller, a memory structure, a charge storage memory, a random access memory, a dynamic random access memory, a logic circuit, a sensor, a nanosensor, an integrated transceiver, a micro-mechanical device, a micro-electronic device, a nano-electronic device, a digital circuit, a radio-frequency identification (RFID) chip and a chip card module.

20. The integrated circuit structure of claim 8, the electronic circuit comprising a memory structure, wherein the memory structure includes at least one of the following: a volatile memory, a DRAM, a PROM, an EPROM, an EEPROM, a flash memory, a floating gate memory, a charge trapping memory, an MRAM, a CBRAM, and a PCRAM.

21. The integrated circuit structure of claim 8, the electronic circuit comprising an electronic component, wherein the electronic component includes at least one of the following: a transistor, a fin field effect transistor (FinFET), a power transistor, a bipolar transistor, an insulated gate bipolar transistor (IGBT)), a test structure.

* * * * *